(12) United States Patent
Okasaka

(10) Patent No.: US 6,230,280 B1
(45) Date of Patent: May 8, 2001

(54) SYNCHRONOUS SEMICONDUCTOR MEMORY DEVICE CAPABLE OF GENERATING STABLE INTERNAL VOLTAGE

(75) Inventor: Yasuhiko Okasaka, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/235,151

(22) Filed: Jan. 22, 1999

(30) Foreign Application Priority Data

Jun. 26, 1998 (JP) .................................................. 10-180769

(51) Int. Cl.[7] ...................................................... G06F 1/04
(52) U.S. Cl. .............................................................. 713/400
(58) Field of Search ................................. 713/300, 310, 713/400, 600; 711/154, 155

(56) References Cited

U.S. PATENT DOCUMENTS

| | | | |
|---|---|---|---|
| 5,013,982 | * 5/1991 | Sasaki | 318/114 |
| 5,202,725 | * 4/1993 | Oku | 355/69 |
| 5,543,668 | * 8/1996 | Fong | 307/110 |
| 5,991,221 | * 11/1999 | Ishikawa et al. | 365/226 |
| 6,019,282 | * 7/2000 | Kim | 327/536 |

FOREIGN PATENT DOCUMENTS 9-180446   7/1997   (JP) .

* cited by examiner

Primary Examiner—Thomas M. Heckler
(74) Attorney, Agent, or Firm—McDermott, Will & Emery

(57) ABSTRACT

An internal high voltage to be used in an output circuit is generated by a plurality of charge pumps according to an externally supplied clock signal, and commonly provided to output buffers of the output circuit. In a clock synchronous semiconductor device, chip occupation area as well as current dissipation can be decreased.

20 Claims, 12 Drawing Sheets

SYNCHRONOUS SEMICONDUCTOR MEMORY DEVICE CAPABLE OF GENERATING STABLE INTERNAL VOLTAGE

BACKGROUND OF THE INVENTION

1. Field of the Invention

The present invention relates to a synchronous semiconductor memory device operating in synchronization with a clock signal consisting of a series of externally supplied pulses, and more particularly to a configuration of an internal voltage generating circuit for generating an internal voltage.

2. Description of the Background Art

FIG. 22 is a diagram schematically showing an entire configuration of a conventional synchronous semiconductor device. Shown in FIG. 22 is a configuration of a clock synchronous semiconductor memory device, as an example of a synchronous semiconductor device, which takes in an external signal and outputs data in synchronization with an external clock signal ext.CLK.

With reference to FIG. 22, a clock synchronous semiconductor memory device 100 includes a memory array 102 having a plurality of memory cells arranged in rows and columns; a clock input buffer 104 for buffering an externally supplied clock signal ext.CLK to generate an internal clock signal CLK; a command decoder 106 for taking in external control signals, i.e., a row address strobe signal /RAS, a column address strobe signal /CAS and a write enable signal /WE, in synchronization with internal clock signal CLK from clock input buffer 104, and generating an operation mode designating signal based on a combination of states of these control signals at a rising of internal clock signal CLK; and a control circuit 108 responsive to the operation mode designating signal from command decoder 106 for performing control necessary for execution of the designated operation mode in synchronization with internal clock signal CLK. Command decoder 106 determines the combination of the states of the control signals /RAS, /CAS and /WE at a rising of internal clock signal CLK, and generates the operation mode designating signal based on the result of determination. The combination of the states of these control signals is called a "command."

Synchronous semiconductor memory device 100 further includes an address input buffer 110 for taking in an external address signal ADD and generating an internal address signal in synchronization with internal clock signal CLK under the control of control circuit 108; a row selection circuit 112 operating under the control of control circuit 108 to drive an addressed row of memory array 102 to a selected state according to an internal row address signal supplied from address input buffer 110; a column selection circuit 114 operating under the control of control circuit 108 to select a column of memory array 102 according to an internal column address signal from address input buffer 110; a read circuit 116 for reading memory cell data on the column selected by column selection circuit 114 in synchronization with clock signal CLK under the control of control circuit 108; and an output circuit 118 activated under the control of control circuit 108 for sequentially outputting data transferred from read circuit 116.

Column selection circuit 114 changes the received column address signal in a prescribed sequence with the internal column address signal supplied from address input buffer 110 being a leading address, and sequentially selects columns of memory array 102. Read circuit 116 reads and transfers data according to internal clock signal CLK under the control of control circuit 108.

Output circuit 118 is supplied with a high voltage Vpp from an internal high voltage generating circuit 120. This is because, as will be described later in detail, the last output stage of output circuit 118 is composed of n channel MOS transistors, and there is a need to prevent the voltage level reduction of the high level of the output data Q due to a threshold voltage loss of the n channel MOS transistor at the last output stage. Now, an operation of the dock synchronous semiconductor memory device shown in FIG. 22 will be described with reference to a timing chart shown in FIG. 23.

At arising of external clock signal ext.CLK in a clock cycle #1, row address strobe signal /RAS is set at a low (L) level and column address strobe signal /CAS and write enable signal /WE are each set at a high (H) level, and thus an active command is supplied. In response to the supplied active command, command decoder 106 generates and applies to control circuit 108 an array activation instructing signal. According to this array activation instructing signal, control circuit 108 causes address input buffer 110 to take in address signal ADD and to generate an internal row address signal X. Row selection circuit 112 operates under the control of control circuit 108, and drives a word line corresponding to an addressed row of memory array 102 to a selected state according to the internal row address signal X (a word line is provided corresponding to each memory cell row).

When column address strobe signal /CAS is set at an L level and row address strobe signal /RAS and write enable signal /WE are set at an H level at a rising of external clock signal ext.CLK in clock cycle #3, a read command is supplied, which instructs data reading. According to a data reading designation signal from command decoder 106, control circuit 108 causes address input buffer 110 to take in currently applied address signal ADD and to generate an internal column address signal Y.

Column selection circuit 114 sequentially selects columns in memory array 102 in a prescribed sequence with the address signal Y being a leading address. Data of the memory cell selected by column selection circuit 114 is transmitted to read circuit 116. Read circuit 116 sequentially transfers the transmitted data in synchronization with internal clock signal CLK under the control of control circuit 108, and provides the data to output circuit 118. Output circuit 118 is then activated also under the control of control circuit 108, and outputs the data supplied from read circuit 116.

A certain period of time is required for the selection of a memory cell column by column selection circuit 114 as well as transfer of internal read data by read circuit 116. Therefore, read data Q is set at a definite state at a rising of external clock signal ext.CLK in clock cycle #5 after two clock cycles since supplying of the read command. Thereafter, column selection circuit 114 sequentially selects memory cell columns in a prescribed sequence with address signal Y used as a leading address, and data in these memory cells are read out in synchroization with clock signal CLK. Data Q1, Q2 and Q3 become definite at rising of external clock signal ext.CLK in clock cycles #6, #7 and #8, respectively.

Output circuit 118 enters an output high impedance state after a prescribed number of data pieces are read out. The number of data pieces consecutively read out after a read command is supplied is called a burst length; the number of clock cycles required after supplying of the read command until a valid data is output is called a CAS latency.

Reading data out in synchronization with external clock signal ext.CLK enables to transfer data to a processor (not shown) in synchronization with the external clock signal ext.CLK, which permits high-speed data transfer. Accordingly, it becomes possible to prevent degradation of the performance of a processing system due to the difference in operating frequency between a processor and a main memory when a standard DRAM is used as the main memory.

Command decoder 106 may be configured to be supplied with a prescribed bit of address signal ADD. Clock input buffer 104 may be formed of a PLL (Phase Locked Loop), for example. Internal clock signal CLK has only to be a clock signal in synchronization with external clock signal ext.CLK.

FIG. 24 is a diagram schematically showing a configuration of the last stage of output circuit 118 shown in FIG. 22. Referring to FIG. 24, output circuit 118 includes a level conversion circuit 118a for converting the H level of an internal read data RD to a high voltage Vpp level; an n channel MOS transistor 118b connected between a power supply node receiving a power supply voltage Vccq and an output node 118d and having a gate receiving an output signal of level conversion circuit 118a; and an n channel MOS transistor 118c connected between output node 118d and a ground node and having a gate receiving an internal read data ZRD. Internal read data RD and ZRD are data complementary to each other.

Configuration of the last output stage with n channel MOS transistors 118b and 118c avoids the necessity of a region for PN junction isolation, thereby reducing circuit occupation area and implementing a latch-up free circuit. With such a configuration, however, a problem of the threshold voltage loss arises because of n channel MOS transistor 118b used to generate an H level data. Level conversion circuit 118a converts the II level of internal read data RD (internal operation power supply voltage level) into an internal high voltage Vpp level. This internal high voltage Vpp is at a voltage level equal to or higher than Vccq+Vth, in which Vth represents a threshold voltage of n channel MOS transistor 118b. Accordingly, a signal at a level of power supply voltage Vccq can be transmitted to output node 118d, without a threshold voltage loss at MOS transistor 118b.

FIG. 25 is a diagram showing an exemplary configuration of level conversion circuit 118a shown in FIG. 24. With reference to FIG. 25, level conversion circuit 118a includes a p channel MOS transistor PT1 connected between a high voltage supply node and an internal node 118aa and having a gate connected to an internal node 118ab; a p channel MOS transistor PT2 connected between the high voltage supply node and node 118ab and having a gate connected to node 118aa; an n channel MOS transistor NT1 connected between internal node 118aa and a ground node and having a gate receiving internal read data RD; and an n channel MOS transistor NT2 connected between internal node 118ab and the ground node and having a gate receiving internal read data RD via an inverter IV.

Internal read data RD is at an internal power supply voltage level. When internal read data RD is at an H level, an output signal of inverter IV is at an L level, MOS transistor NT1 is in an ON state, and MOS transistor NT2 is in an OFF state. When node 118aa is discharged via MOS transistor NT1, conductance of MOS transistor PT2 increases, and node 118ab is charged via MOS transistor PT2, and has the voltage level thus increased. According to the voltage increase of the node 118ab, conductance of MOS transistor PT1 decreases, and node 118aa is discharged to a ground voltage level at high speed. Consequently, node 118ab ultimately attains the internal high voltage Vpp level, and internal node 118aa attains the ground voltage level. Conversely, if internal read data RD is at the ground voltage level, MOS transistor NT1 is in an OFF state, MOS transistor NT2 is in an ON state, and thus node 118aa attains internal high voltage Vpp level, and internal node 118ab attains the ground voltage level. This node 118ab is connected to a gate of outputting n channel MOS transistor 118b shown in FIG. 24.

Level conversion circuit 118a has only to drive the gate of outputting MOS transistor 118b, and needs only a small current drivability. In a latch state in which one of internal nodes 118aa and 118ab is at internal high voltage Vpp level and the other is at the ground voltage level, a current flowing path is blocked, whereby low current dissipation is realized.

Now, output circuit 118 shown in FIG. 22 is considered to have a configuration that outputs a plurality of bits of output data Q0 to Qn, as shown in FIG. 26. Output buffers 128-0 to 128-n are provided corresponding to output data bits Q0 to Qn, respectively. These output buffers 128-0 to 128-n each have a configuration substantially the same as that shown in FIG. 24. Output buffers 128-0 to 128-n are supplied with outputting power supply voltage Vccq via an external pin terminal 129. Internal high voltage Vpp from internal high voltage generating circuit 120 is commonly applied to the level conversion circuits included in the output buffers 128-0 to 128-n. Due to such application of outputting power supply voltage Vccq from an outside via pin terminal 129, even if output buffers 128-0 to 128-n to operate in parallel to consume a large amount of current, the fluctuation of the power supply voltage will have no effects on other internal circuits, thereby preventing malfunction of the internal circuits. The application of outputting power supply voltage Vccq from the outside also allows a power source for the last stage of output buffers 128-0 to 128n to have a large current drivability, which ensures stable data output even when the data is output in synchronization with high-speed clock signal ext.CLK.

Internal high voltage Vpp is commonly applied to output buffers 128-0 to 128-n from internal high voltage generating circuit 120 provided within the synchronous semiconductor memory device. Level conversion circuit 118a shown in FIG. 24 has only to charge and discharge gate capacitance of outputting MOS transistor 118b, and needs only a small current drivability. However, if the number of output data bits Q0-Qn increases to 16 bits or to 32 bits, for example, current dissipation at the level conversion circuits included in output buffers 128-0 to 128-n at data reading becomes inneligible.

FIG. 27 is a diagram schematically showing a configuration of internal high voltage generating circuit 120 shown in FIGS. 22 and 26. In FIG. 27, internal high voltage generating circuit 120 includes a ring oscillator 120a oscillating at a prescribed cycle, and a charge pumping circuit 120b generating internal high voltage Vpp by a charge pumping operation of a capacitor according to an output signal of ring oscillator 120a. To increase charge supplying capability of internal high voltage generating circuit 120, it is required to increase an oscillating frequency f of ring oscillator 120a and a capacitance value C of a charge pumping capacitor included in charge pumping circuit 120b. The higher the oscillating frequency of ring oscillator 120a is set, the larger a current consumed by switching operation at ring oscillator 120a becomes. In addition, the increase in the capacitance value of the capacitor included in charge pumping circuit 120b leads to increase in capacitor occupation area, and hence in circuit occupation area.

Since design resources for normal standard DRAMs (Dynamic Random Access Memories) are inherited in configuring internal high voltage generating circuit 120, circuit configuration and layout with an osciliating frequency of ring oscillator 120a and a capacitance value of the charge pumping capacitor of charge pumping circuit 120b both optimized for a standard DRAM are employed. Therefore, when a large number of output buffers 128-0 to 128-n are operated in parallel in synchronization with high-speed clock signal ext.CLK, the charge supplying capability is insufficient, and the voltage level of internal high voltage Vpp decreases, making it impossible to drive outputting MOS transistor 118b shown in FIG. 24 to a strong ON state. In this case, even if the threshold voltage loss does not occur, conductance of outputting MOS transistor 118b is not large enough to drive outputting data bits Q0 to Qn to an H level of power supply voltage Vccq level at high speed, thus hindering high speed data reading.

Further, even at the time when internal power voltage Vpp is stably supplied, since the length of an internal interconnection line transmitting the internal high voltage Vpp becomes longer as the number of output buffers 128-0 to 128-n is larger, a large current flows on the internal high voltage transmission line while output buffers 128-0 to 128-n are in operation, and the line resistance of this internal high voltage Vpp transmission line causes the voltage level of internal high voltage Vpp supplied to output buffers 128-0 to 128-n to change. At this time, the output voltage levels of level conversion circuits 118a included in output buffers 128-0 to 128-n change accordingly. As a result, the driving rate of data output bits Q0 to Qn of output buffers 128-0 to 128-n to an H level will vary from each other, thus making impossible to read data at high speed (the data reading speed is determined according to the worst case).

SUMMARY OF THE INVENTION

An object of the present invention is to provide a synchronous semiconductor memory device capable of stably outputting data at high speed without increasing circuit occupation area even when the number of bits in output data increases.

Another object of the present invention is to provide a synchronous semiconductor memory device including an internal high voltage generating circuit capable of stably supplying an internal high voltage Vpp at a constant voltage level to output buffers operating in parallel.

A synchronous semiconductor device according to the present invention includes a plurality of internal voltage generating circuits performing charge pumping operation according to an external clock signal to generate internal voltages, and an internal circuit commonly receiving the internal voltages from the plurality of internal voltage generating circuits for operation The plurality of internal voltage generating circuits axe provided separately.

As the internal voltages generated by using a plurality of internal voltage generating circuits are commonly provided to an internal circuit, the internal voltage generation source is enhanced, so that stable internal voltages can be transmitted to the internal circuit. Further, as the internal voltages are generated by performing charge pumping operation according to clock signals, a ring oscillator is no longer needed, and therefore, circuit occupation area as well as current dissipation can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
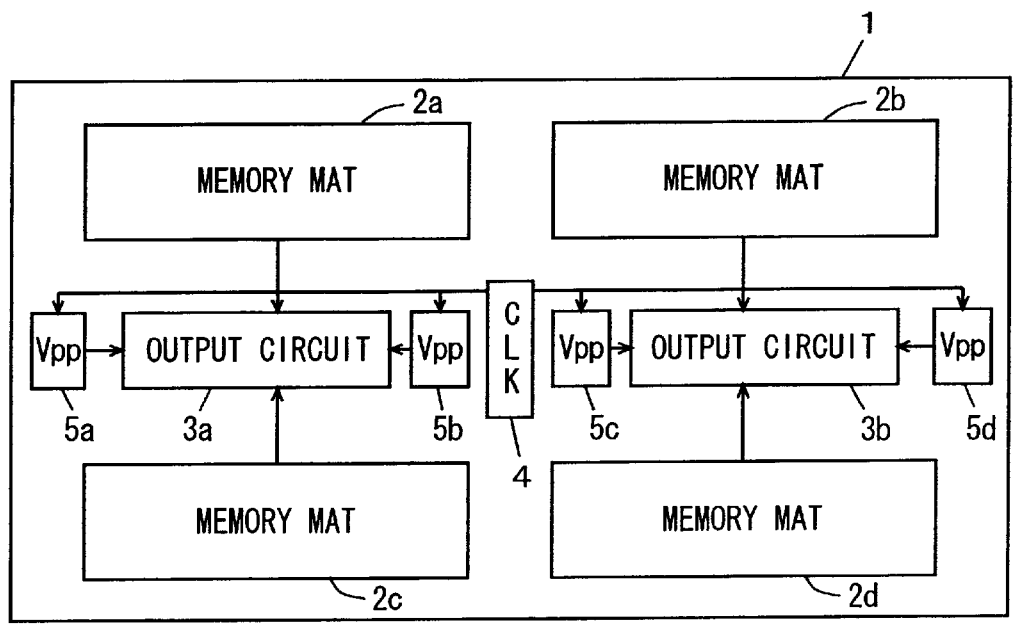
FIG. 1 is a diagram schematically showing an entire configuration of a synchronous semiconductor memory device according to the present invention.

FIG. 1 is a diagram schematically showing an entire configuration of a synchronous semiconductor memory device according to the first embodiment of the present invention. With reference to FIG. 1, the synchronous semiconductor memory device 1 includes memory mats 2a, 2b, 2c and 2d each including a plurality of memory cells arranges in rows and columns. Row selection circuits and column selection circuits are provided corresponding to respective memory mats 2a–2d.

Between memory mats 2a and 2c, an output circuit 3a is provided for externally outputting data read out of memory mats 2a and 2c. An output circuit 3b is provided between memory mats 2b and 2d for externally outputting data read out of memory mats 2b and 2d.

An internal clock generating circuit 4 is disposed near the central region among memory mats 2a–2d, and receives a clock signal from an outside and generates an internal clock signal. CLK Further, charge pump circuits (internal voltage generating circuits) 5a and 5b are disposed at both sides of output circuit 3a, and perform charge pumping operation in synchronization with internal clock signal CLK from internal clock generating circuit 4 to generate internal high voltage Vpp and provide the same to output circuit 3a. Similarly, at both sides of output circuit 3b, charge pump circuits 5c and 5d are provided, each of which performs charge pumping operation in accordance with internal clock signal CLK from internal clock generating circuit 4, and generates and provides to output circuit 3b internal high voltage Vpp.

The synchronous semiconductor memory device shown in FIG. 1 has a so called LOC (Lead On Chip) structure. At the central portion of the chip, pads for applying and receiving signals to and from an outside are arranged, and peripheral circuits are disposed corresponding to respective pads at the central portion of the chip. Accordingly, the internal clock signal from internal clock generating circuit 4 can be transmitted to charge pump circuits 5a, 5b, 5c and 5d disposed at the central region in a relatively short interconnection line distance. Since the internal clock signal transmission lines extend substantially linearly, they are prevented from being complicated, and thus the internal clock signal can readily be transmitted to charge pump circuits 5a–5d.

Since charge pump circuits 5a and 5b are disposed at both sides of output circuit 3a to supply internal high voltages Vpp to output circuit 3a from its both sides, the high voltage source is enhanced, and therefore, a stable supply of internal high voltage Vpp to output circuit 3a is ensured. Likewise, internal high voltages Vpp are supplied to output circuit 3b from charge pump circuits 5c and 5d provided at its opposite sides, and therefore, the internal high voltage supplying source is enhanced, ensuring a stable supply of internal high voltage Vpp to output circuit 3b.

In addition, charge pump circuits 5a–5d are provided merely for charge pumping operation, and receive internal clock signal CLK from internal clock generating circuit 4. The necessity to provide a ring oscillator dedicated for generating internal high voltage Vpp is eliminated, suppressing increase in chip area.

In the region among memory mats 2a–2d of this synchronous semiconductor memory device, peripheral circuits including a control circuit and a power supply circuit for supplying outputting power supply voltage Vccq to output circuits 3a and 3b are disposed, which are not illustrated in FIG. 1 for simplicity.

Figure 2:
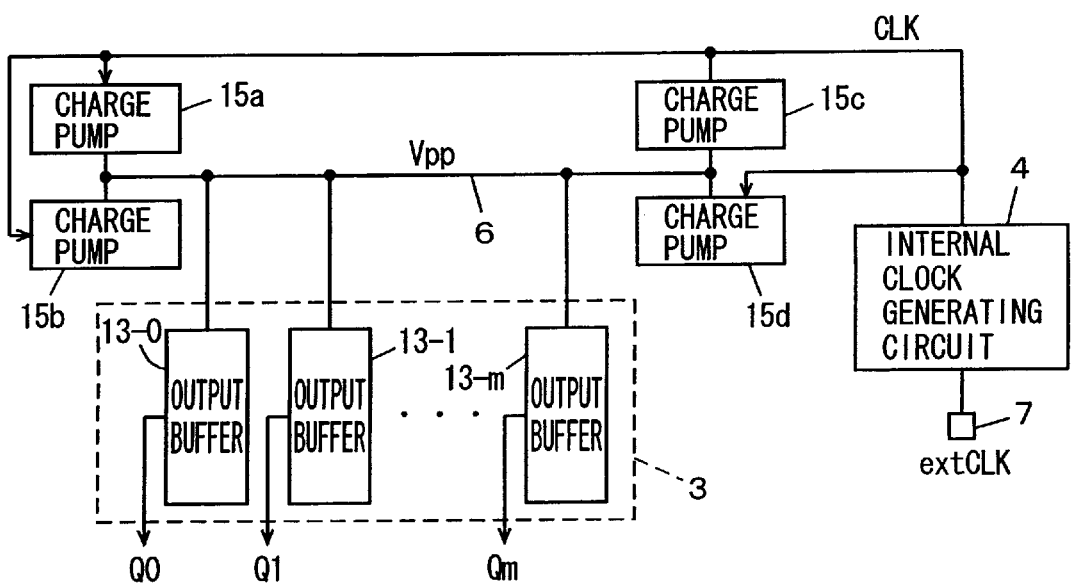
FIG. 2 is a diagram schematically showing a configuration of a main portion of a synchronous semiconductor memory device according to a first embodiment of the present invention.

FIG. 2 is a diagram showing in more detail configurations of the output circuit and the charge pump circuit shown in FIG. 1. Since output circuits 3a and 3b, and charge pump circuits 5a, 5b, 5c and 5d have identical configurations, respectively, a configuration for one output circuit 3 is shown in FIG. 2.

Figure 24:
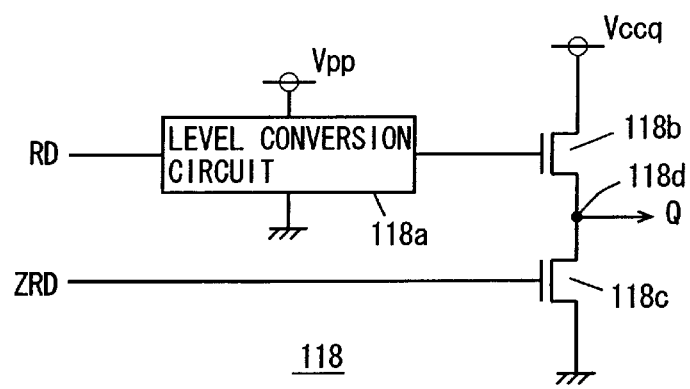
FIG. 24 is a diagram schematically showing a configuration of the output circuit in FIG. 22.
Figure 25:
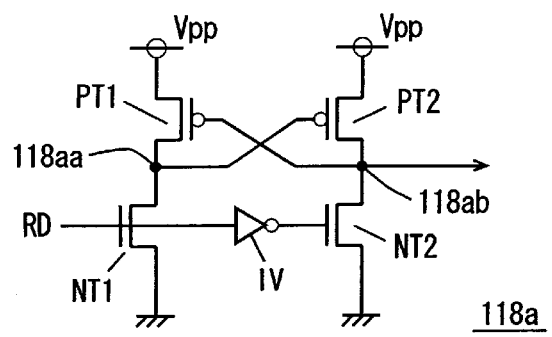
FIG. 25 is a diagram showing a configuration of the level conversion circuit in FIG. 24.
Figure 26:
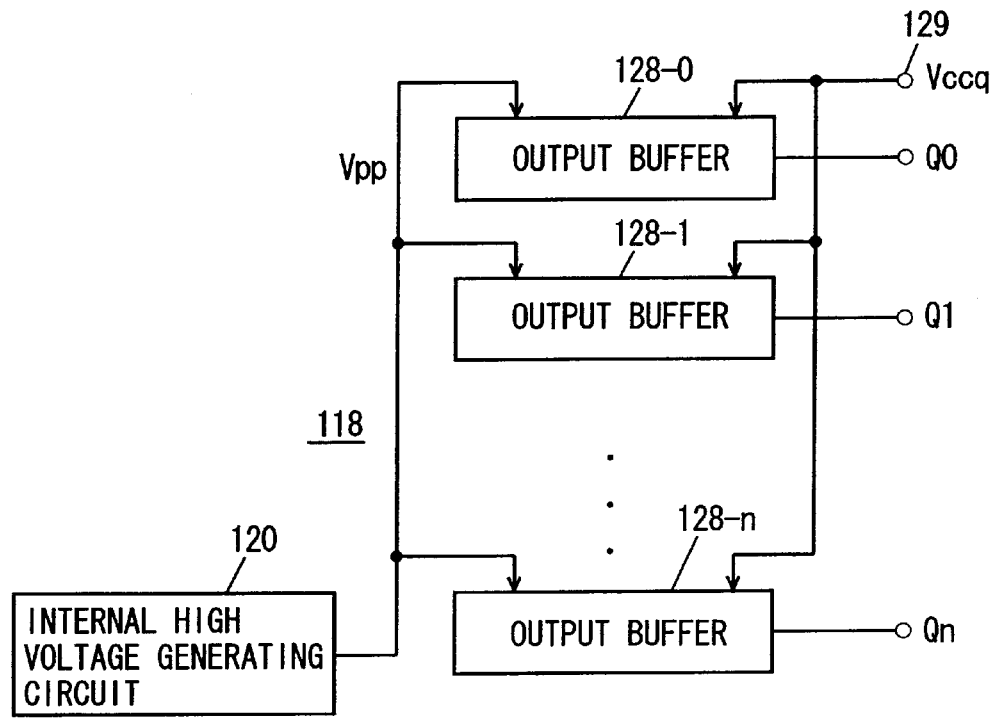
FIG. 26 is a diagram showing a specific configuration of the output circuit in FIG. 22.
Figure 27:
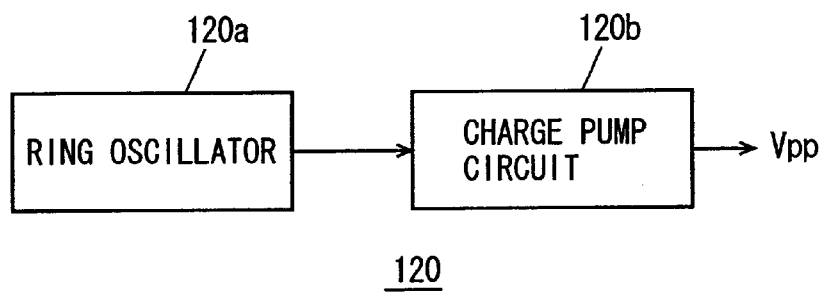
FIG. 27 is a diagram schematically showing a configuration of the internal high voltage generating circuit in FIG. 26.

With reference to FIG. 2, output circuit 3 includes output buffer 13-0 to 13-m, which are provided in parallel to each other to receive data in parallel from selected memory cells in corresponding memory mats, for outputting data bits Q0 to Qm. These output buffers 13-0 to 13-m each have the configuration identical to that shown in FIG. 24.

On one side of output circuit 3, charge pumps 15a and 15b are provided, and on the opposing side of output circuit 3, charge pumps 15c and 15d are provided. Charge pumps 15a–15d are commonly supplied with internal clock signal CLK from internal clock generating circuit 4. Each of charge pumps 15a–15d performs charge pumping operation according to internal clock signal CLK, and generates internal high voltage Vpp on an internal high voltage line 6.

Internal high voltage line 6 receives charges from its both ends, and transmits internal high voltage Vpp to output buffers 13-0 to 13-m. Accordingly, internal high voltage Vpp on internal high voltage line 6 is stably supplied, and distribution of a voltage level (voltage drop due to interconnection line resistance) of internal high voltage Vpp on internal high voltage line 6 can be suppressed. Specifically, since internal high voltage line 6 is supplied with charges from its both ends, the effective interconnection line length can be halved. Therefore, even if a current flows onto internal high voltage line 6 when output buffers 13-0 to 13-m are in operation, fluctuation of the voltage level is suppressed, and stable supply of internal high voltage Vpp to output buffers 13-0 to 13-m is ensured.

Internal clock generating circuit 4 receives external clock signal ext.CLK from a pad 7 provided in the vicinity thereof, and generates internal clock signal CLK. Internal clock generating circuit 4 may be configured to have a driver at its output portion for applying internal clock signal CLK to charge pumps 15a–15d with relatively large driving capability. In other words, provision of a clock driver transmitting the internal clock signal leads to suppression of adverse effects on another internal circuit operating according to the internal clock signal, and ensures stable transmission of the internal clock signal to the charge pumps.

Internal clock generating circuit 4 may be a buffer circuit, or phase locked circuits such as a PLL or a DLL (Delayed Locked Loop).

Figure 3:
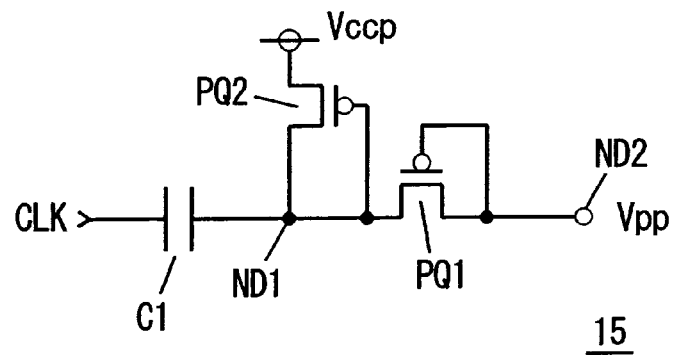
FIG. 3 is a diagram showing a configuration of the charge pumps in FIG. 2.

FIG. 3 is a diagram showing an example of configurations of charge pumps 15a–15d shown in FIG. 2. Since charge pumps 15a–15d have identical configurations, FIG. 3 only shows one charge pump 15, representatively.

Referring to FIG. 3, charge pump 15 includes a charge pumping capacitor C1 performing charge pumping operation according to internal clock signal CLK to supply charges to a node ND1; a p channel MOS transistor PQ1 connected between node ND1 and an output node ND2 and having a gate connected to output node ND2; and a p channel MOS transistor PQ2 connected between a power supply node receiving an external power supply voltage Vccp and the internal ND1 and having a gate connected to node ND1.

In the charge pump circuit having the configuration shown in FIG. 3, the voltage at node ND1 alters between Vccp−Vthp and 2·Vthp−Vthp. Here, internal clock signal CLK is assumed to alter between a ground voltage and external power supply voltage Vccp. When the voltage at node ND1 is higher than that at node ND2 by at least the absolute value of the threshold voltage Vthp, MOS transistor PQ1 attains an ON state and supplies positive charge from node ND1 ta nodo ND2. Consequently, internal high voltage Vpp of output node ND2 attains a voltage level of 2·Vthp−2·Vthp.

The amount of positive charges transmitted to node ND2 per unit time is proportional to the product of the frequency of internal clock signal CLK and the capacitance value of charge pumping capacitor C1. Therefore, when the frequency of internal clock signal CLK is high, e.g., at 100 MHz, the capacitance value of charge pumping capacitor C1 can be made smaller, enabling reduction of its occupation area.

Note that FIG. 3 only shows an exemplary configuration of the charge pump. Various configurations of charge pumps can be used alternatively.

Figure 4:
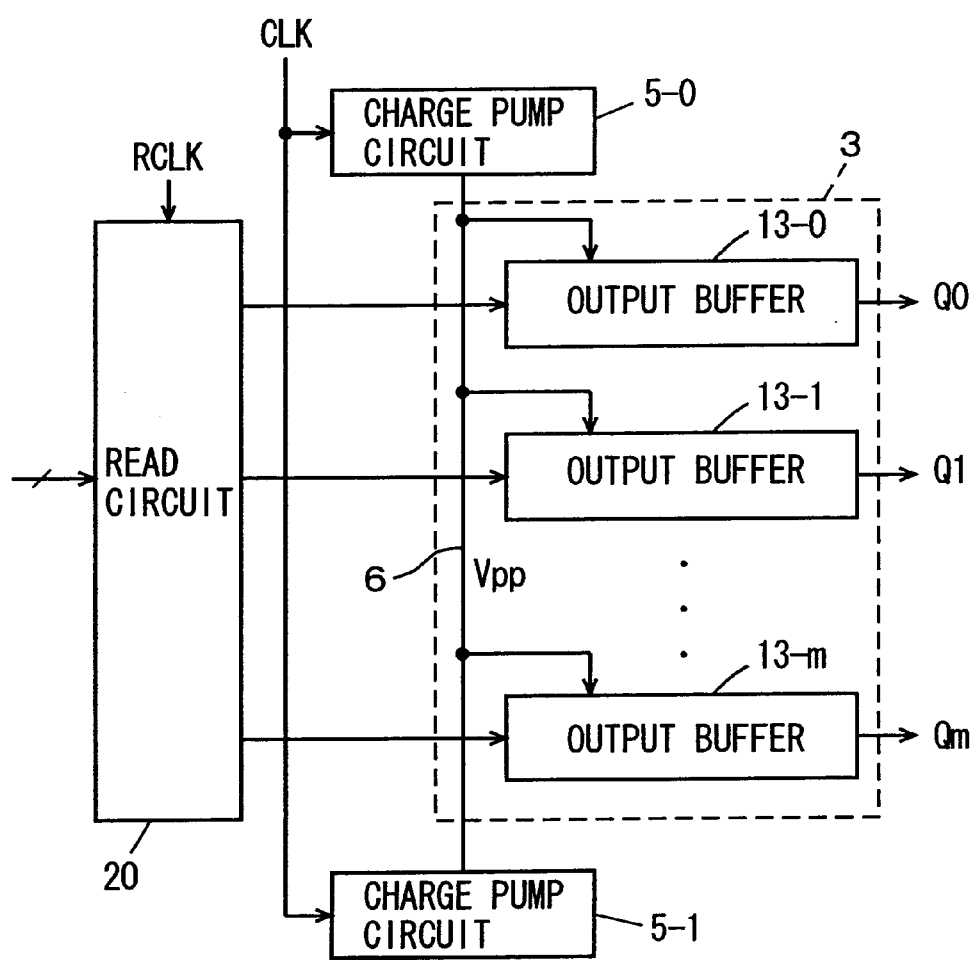
FIG. 4 is a diagram schematically showing a configuration of a data output portion according to the first embodiment of the present invention.

FIG. 4 shows in more detail a configuration of a data reading portion of the synchronous semiconductor memory device according to the first embodiment of the present invention. As shown in FIG. 4, in the data reading operation, a read circuit 20 reads memory cell data in synchronization with a read clock signal RCLK, and the memory cell data are supplied in parallel to output buffers 13-0 to 13-M included in output circuit 3. Charge pump circuits 5-0 and 5-1 are disposed at opposing sides of output circuit 3, and are provided with internal clock signal CLK. Accordingly, charge pump circuits 5-0 and 5-1 can be arranged without affecting the layout of read circuit 20 or a read data transmission line between the read circuit 20 and output circuit 3 Internal high voltage line 6 and a signal line for transmitting internal clock signal CLK are formed in an interconnection layer different from that for the read data transmission line from read circuit 20, whereby butting of the interconnection lines can be avoided.

As described above, according to the first embodiment of the present invention, the internal high voltage is generated by performing charge pumping operation according to the externally supplied clock signal, and then supplied to the output buffers. Accordingly, the necessity of a ring oscillator is eliminated, and current dissipation as well as chip occupation area of the internal high voltage generating circuit can be reduced.

Further, charge pump circuits are disposed at both sides of the output circuit. Therefore, stable supply of internal high voltage Vpp to the output buffers is ensured without affecting the layout of the internal read data line for the output circuit.

Second Embodiment

Figure 5A:
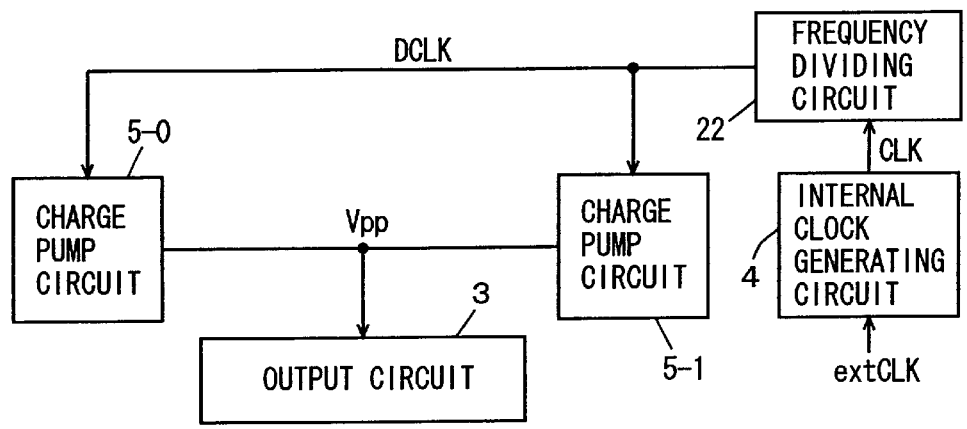
FIG. 5A schematically shows a configuration of a main portion of a synchronous semiconductor memory device according to a second embodiment of the present invention.

FIG. 5A is a diagram schematically showing a configuration of the main portion of a synchronous semiconductor memory device according to the second embodiment of the present invention. With reference to FIG. 5A, a frequency dividing circuit 22 is commonly provided for charge pump circuits 5-0 and 5-1, each of which supplies internal high voltage Vpp to output circuit 3. Frequency dividing circuit 22 frequency-divides internal clock signal CLK from internal clock generating circuit 4 by a prescribed ratio to generate frequency divided clock signals, and supplies the signals to charge pump circuits 5-0 and 5-1. Except for this arrangement, the configuration of the second embodiment is identical to that of the first embodiment. Charge pump circuits 5-0 and 5-1, an exemplary configuration of which is shown in FIG. 3, include charge pumping capacitors, respectively. When the external clock signal ext.CLK (internal clock signal CLK) is at a high frequency, the charge pumps perform charge pumping operation according to this high-speed clock signal. Therefore, the charge supplying capability of the charge pump circuits may become unnecessarily large. In this case, the MOS transistor for precharging an internal node, as shown in FIG. 3, repeatedly performs precharging operation of the internal node, thus consuming current unnecessarily. At this time, if the voltage level of internal high voltage Vpp is equal to or higher than a prescribed voltage level, the MOS transistor at the output portion of the charge pump will remain non-conductive, thereby transferring no charges. Therefore, charge pump circuits 5-0 and 5-1 may come to have unnecessarily large charge supplying capability, leading to unnecessary consumption of current. So, frequency dividing circuit 22 is provided for frequency-dividing internal clock signal CLK from internal clock generating circuit 4 to generate frequency divided clock signal DCLK.

Figure 5B:
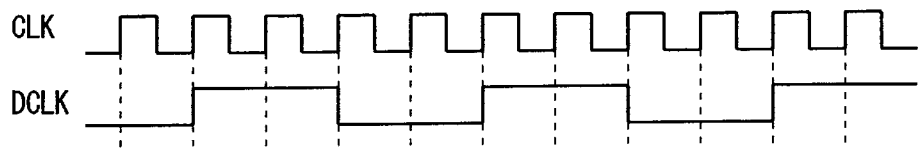
FIG. 5B is a timing chart representing an operation of the frequency dividing circuit shown in FIG. 5A.

FIG. 5B shows waveforms of frequency divided signal DCLK frequency-divided by a factor of 4 by frequency dividing circuit 22. Accordingly, charge pump circuits 5-0 and 5-1 have their charge supplying capabilities adjusted, and thus are prevented from performing unnecessary charge pumping operation, which result in reduction of current dissipation. Further, even when internal clock signal CLK (external clock signal ext.CLK) exceeds an upper limit operating frequency of the charge pump circuit, the use of frequency divided clock signal DCLK enables stable charge pumping operation to generate internal high voltage Vpp.

Modification

Figure 6:
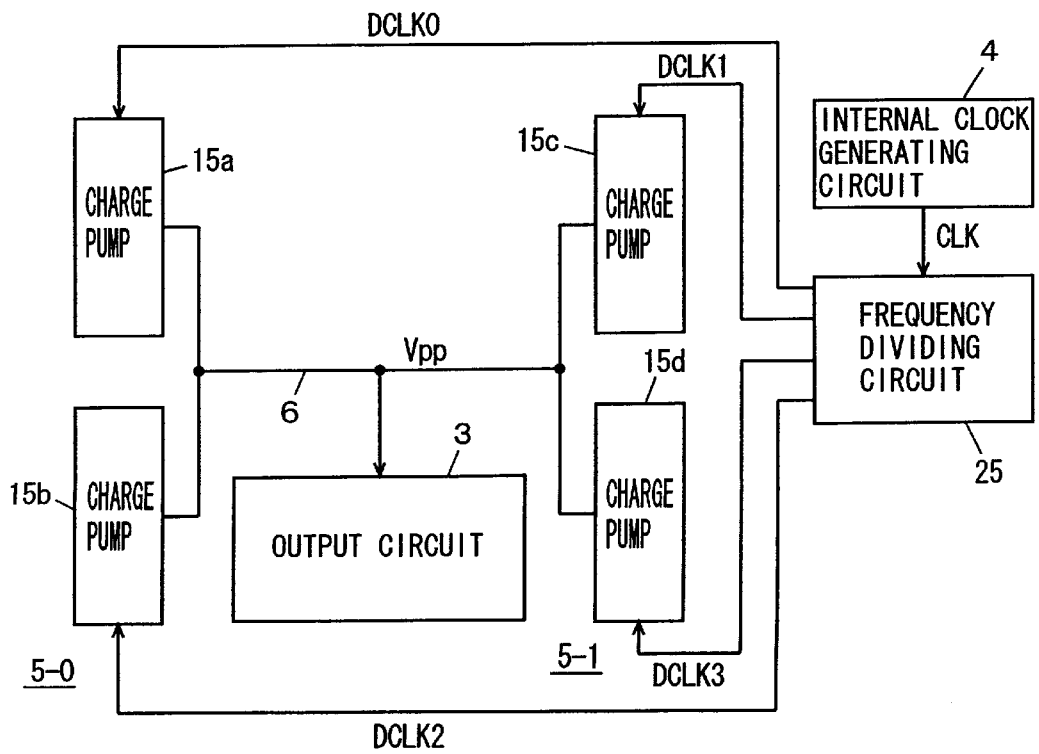
FIG. 6 is a diagram schematically showing a configuration of a modification of the second embodiment of the present invention.

FIG. 6 is a diagram schematically showing a configuration of a modification of the second embodiment of the present invention. Referring to FIG. 6, charge pump circuit 5-0 includes charge pumps 15a and 15b, and charge pump circuit 5-1 includes charge pumps 15c and 15d. A frequency dividing circuit 25 frequency-divides internal clock signal CLK from internal clock generating circuit 4 to generate frequency divided signals DCLK0–DCLK3 out of phase from each other, and supplies the signals to charge pumps 15a–15d Accordingly, charge pumps 15a–15d are out of timing in charge pumping operation from each other.

Figure 7:
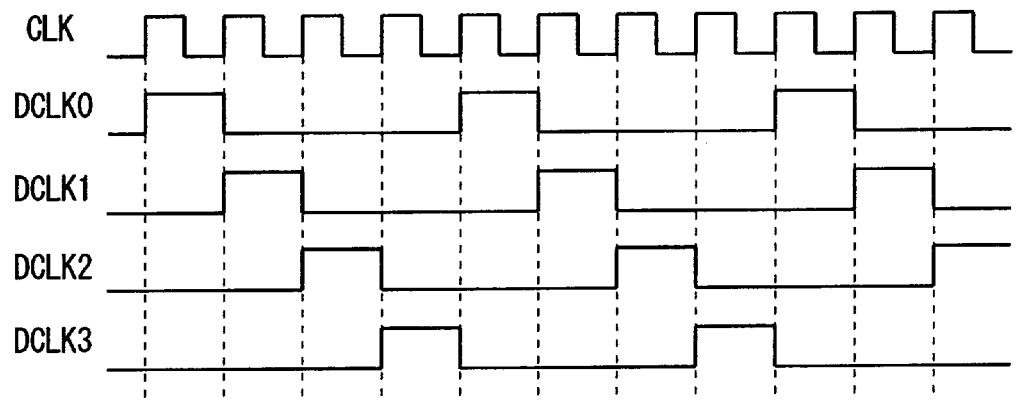
FIG. 7 is a timing chart representing an operation of the frequency dividing circuit FIG. 6.

FIG. 7 is a diagram showing phase relations of frequency divided signals DCLK0–DCLK3 and internal clock signal CLK. As shown in FIG. 7, frequency dividing circuit 25 frequency-divides internal clock signal CLK by 4, and generates frequency divided clock signals DCLK0–DCLK3 out of phase by 90° from each other. Either one of charge pumps 15a–15d operates according to the frequency divided clock signal and supplies charges to internal high voltage line 6. Accordingly, charges are normally supplied onto internal high voltage line 6 when output circuit 3 is in operation, and thus internal high voltage Vpp can be held at a stable, constant voltage level, which ensures stable operation of output circuit 3.

Figure 8:
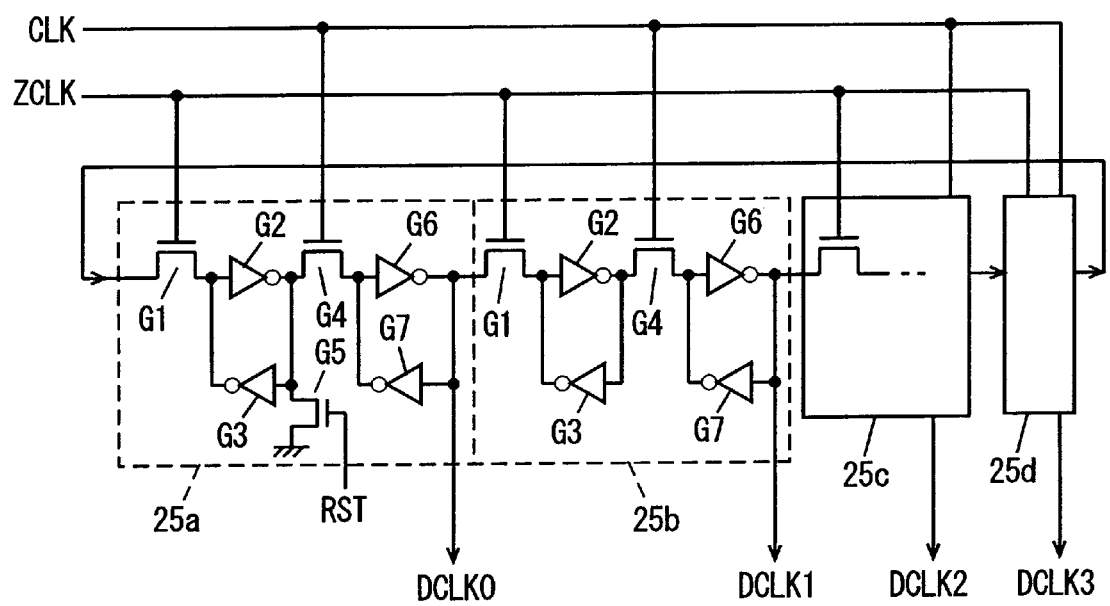
FIG. 8 is a diagram showing a configuration of the frequency dividing circuit in FIG. 6.

FIG. 8 is a diagram showing an exemplary configuration of frequency dividing circuit 25 shown in FIG. 6. With reference to FIG. 8, frequency dividing circuit 25 includes 4 shift register stages 25a–25d performing shifting operation according to two phase internal clock signals CLK and ZLCK. An output signal of shift register 25d at the last stage is transferred to an input portion of shift register 25a at the first stage. Frequency dividing circuit 25 constitutes a circulating shift register circuit connected in a ring form.

Shift register 25a includes a transfer gate G1 conducting in response to a complementary internal clock signal ZCLK; an inverter G2 inverting a signal applied via transfer gate G1; an inverter G3 inverting an output signal of inverter G2 for transference to an input portion of inverter G2; a transfer gate G4 conducting in response to internal clock signal CLK and transmitting the output signal of inverter G2; an inverter G6 inverting an output signal of transfer gate G4; and an inverter G7 inverting an output signal of inverter G6 for transmission to an input portion of inverter G6. The current drivability of inverters G2 and G6 is set larger than that of inverters G3 and G7. Inverters G2 and G3 constitute a latch circuit, and inverters G6 and G7 constitute another latch circuit.

Shift register 25a further includes a reset transistor G5, which sets an output portion of inverter G2 to a ground voltage level according to a reset signal RST. This reset signal RST is held at an activated state for a prescribed time period upon power-up, for example (activated according to a power-up detecting signal or power-on reset signal, for example).

Shift registers 25b–25d have circuit configurations identical to each other, and therefore, the configuration of shift register 25b is shown representatively. Shift register 25b has a configuration the same as that of shift register 25a, except that the former is not provided with reset transistor G5.

Accordingly, in frequency dividing circuit 25 with a configuration shown in FIG. 8, an initialized signal at an H level is sequentially transferred through shift registers 25a–25d according to internal clock signals CLK and ZCLK. Frequency divided clock signals DCLK1, DCLK2 and DCLK3 are output from shift registers 25b, 25c and 25d, respectively.

The use of the configuration as shown in FIG. 8 enables internal clock signal CLK to be frequency-divided into frequency divided clock signals DCLK0–DCLK3 out of phase by 90° from each other.

In the above-described configuration, four charge pumps are provided, and correspondingly, four shift registers stages are provided for frequency dividing circuit 25. When n shift register stages are provided, n charge pumps can sequentially be driven to perform charge pumping operation. In this case, each charge pump operates according to a clock signal obtained by frequency-dividing internal clock signal CLK by a factor of n.

The configuration shown in FIG. 6 may be modified to enable a set of charge pumps 15a and 15c or another set of charge pumps 15b and 15d, to perform charge pumping operation simultaneously. In this case, charge pumps 15a–15d operate in synchronization with frequency-divided-by-2 internal clock signal CLK. Since internal high voltage line 6 is supplied with charges from its both ends, level variation (distribution) of the voltage on internal high voltage line 6 due to interconnection line resistance can be suppressed, and thus stable supply of internal high voltage Vpp to output circuit 3 is ensured.

As described above, the second embodiment of the present invention is configured to frequency-divide the internal clock signal and to perform charge pumping operation according to the frequency-divided clock signals, which assures stable generation of internal high voltage even with a high-speed clock signal, without unnecessarily consuming current. Further, a plurality of charge pumps are configured to sequentially perform charge pumping operation in an interleaved fashion. Accordingly, charges are normally transmitted onto the internal high voltage line, which permits the internal high voltage on the internal high voltage to be held stably at a constant voltage level.

Third Embodiment

Figure 9:
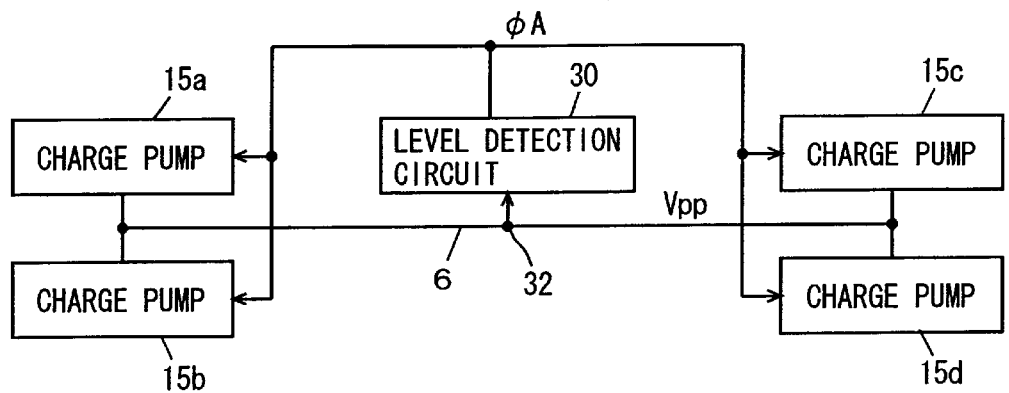
FIG. 9 is a diagram schematically showing a configuration of a main portion of a synchronous semiconductor memory device according to a third embodiment of the invention.

FIG. 9 shows a configuration of the main portion of a synchronous semiconductor memory device according to the third embodiment of the present invention. In the configuration shown in FIG. 9, a level detection circuit 30 is commonly provided for charge pumps 15a–15d. Level detection circuit 30 detects a level of internal high voltage Vpp on a node 32 substantially at the center of internal high voltage line 6, and controls charge pumping operation of charge pumps 15a–15d according to the result of detection. Specifically, the level detection circuit 30 causes charge pumps 15a–15d to stop charge pumping operation when the internal high voltage Vpp on the node 32 is at a level equal to or higher than a prescribed voltage level. Controlling of charge pumping operation of a plurality of charge pumps 15a–15d sing a single level detection circuit 30 leads to reduction in circuit occupation area.

Further, node 32 substantially at the center of internal high voltage line 6 is at a location at a substantially equal distance from each of charge pumps 5a–15d. This means that node 32 is a node most probably at the lowest voltage level on internal high voltage line 6, due to interconnection line resistance. Detection of the voltage level of internal high voltage Vpp at such node 32 enables control of charge pumping operation of charge pumps 15a–15d following the worst voltage level on internal high voltage line 6. Accordingly, internal high voltage Vpp can reliably be held at a voltage level equal to or higher than a prescribed level over the entire internal high voltage line 6, thereby assuring stable operation of the output circuit.

Figure 10A:
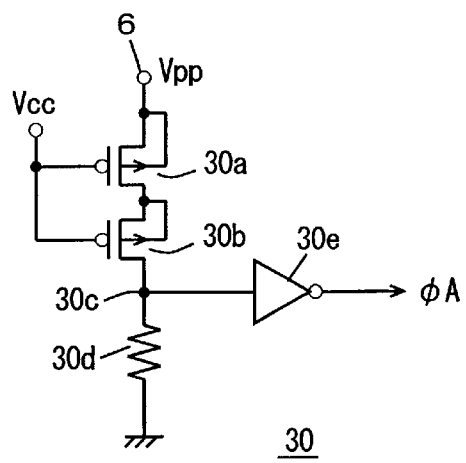
FIG. 10A shows a configuration of the level detection cat shown in FIG. 9.

FIG. 10A shows an exemplary configuration of level detection circuit 30 shown in FIG. 9. Referring to FIG. 10A, level detection circuit 30 includes p channel MOS transistors 30a and 30b serially connected between internal high voltage line 6 and an internal node 30c and having a gate receiving a power supply voltage Vcc, a resistance element 30d with high resistance connected between node 30c and a ground node, and an inverter 30e for inverting a signal on node 30c and outputting a pump control signal φA. Power supply voltage Vcc is selected depending on the voltage level at which internal high voltage Vpp is set. Power supply voltage Vcc may be outputting power supply voltage Vccq, or a power supply voltage Vccp for a peripheral circuit. Another constant reference voltage may also be used.

Figure 10B:
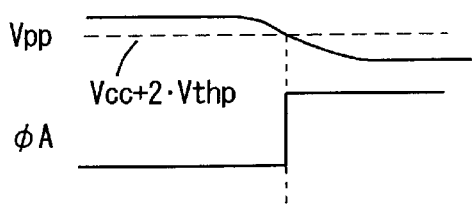
FIG. 10B shows waveforms illustrating an operation of the circuit of FIG. 10A.

Now, operation of level detection circuit 30 shown in FIG. 10A will be described with reference to signal waveforms shown in FIG. 10B.

P channel MOS transistor 30a turns on when the voltage level of internal high voltage Vpp on internal high voltage line 6 is at least voltage Vcc+Vthp. P channel MOS transistor 30b is rendered conductive when the voltage of its source node is at least voltage Vcc+Vthp. Herein, Vthp represents an absolute value of the threshold voltages of p channel MOS transistors 30a and 30b. Therefore, when internal high voltage Vpp is at a voltage level higher than power supply voltage Vcc by at least 2·Vthp, MOS transistors 30a and 30b are both ON, a current flows into resistance element 30d, and node 30c attains a high voltage level Thus, in this case, pump control signal φA is held at an L level.

If internal high voltage Vpp becomes lower than voltage Vcc+2·Vthp, at least one of MOS transistors 30a and 30b turns OFF, no current flows into resistance element 30d, and thus node 30c attains a low voltage level, In response, pump control signal φA attains an H level.

Internal high voltage Vpp can thus be held at a level equal to or higher than a prescribed voltage, Vcc+2·Vthp. A current may flow from internal high voltage line 6 to the ground node via level detection circuit 30. However, the amount of current consumed at level detection circuit 30 can be made negligible with the current drivability of MOS transistors 30a and 30b made sufficiently small, and with the resistance value of resistance element 30d sufficiently large. Therefore, the internal high voltage level detecting operation itself of level detection circuit 30 is reliably prevented from adversely affecting the voltage level of internal high voltage Vpp.

Figure 11:
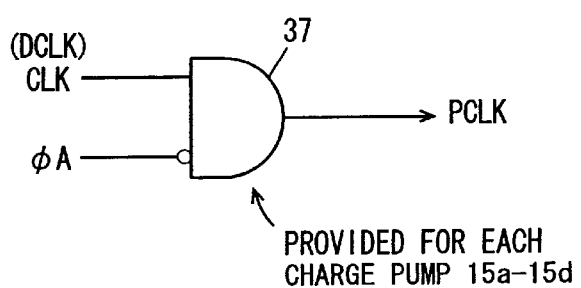
FIG. 11 is a diagram showing a configuration of a pump clock signal control portion provided in the charge pump shown in FIG. 9.

FIG. 11 is a diagram schematically showing a configuration of a control portion provided at a clock input portion of each of charge pumps 15a–15d. In FIG. 11, the control portion includes a gate circuit 37, which receives internal clock signal CLK and pump control signal φA, and applies a pump clock signal PCLK to a corresponding charge pump. When pump control signal φA is at an L level, gate circuit 37 is enabled to generate pump clock signal PCLK according to internal clock signal CLK. When pump control signal φA is at an H level, gate circuit 37 is disabled, thereby fixing pump clock signal PCLK at an L level. Accordingly, pumping operation of respective charge pumps 15a–15d can be controlled according to pump control signal φA from level detection circuit 30. Lengths of interconnection lines of control signal φA as well as control timings can be made substantially the same for the charge pumps 15a–15d.

Gate circuit 37 shown in FIG. 11 is supplied with internal clock signal CLK. Alternatively, frequency divided signal DCLK (DCLK0–DCLK3) as described in the second embodiment may be applied. The number of charge pumps may be any number other than 4, and as long as level detection circuit 30 detects the voltage level of a node at equal distances from these plurality of charge pumps, the same effects as in the above-described embodiment can be provided.

In addition, in level detection circuit 30 having a configuration as shown in FIG. 10A, a switching element may be provided between a resistance element 30d and the ground node to perform level detecting operation at a prescribed interval. Alternatively, level detection circuit 30 may be configured to be activated only during the time period in which the internal high voltage is in use, ie., the time period in which data reading is performed. In the case of a synchronous semiconductor memory device, there exist a time period called a CAS latency after supplying of a read command instructing data reading until read data is actually output to an outside. Therefore, level detection circuit 30 may be configured to be active during the time period corresponding to the CAS latency followed by a burst length after the read command is supplied.

As described above, according to the third embodiment of the present invention, a level detection circuit is commonly provided for a plurality of charge pumps, and pumping operation of the charge pumps is controlled based on the result of detection of the internal high voltage level by the level detection circuit. Therefore, an internal high voltage at or higher than a prescribed voltage level can be transmitted onto the internal high voltage line accurately, without increasing circuit occupation area.

Further, level detection circuit 30 is configured to detect the internal high voltage level of a node substantially at equal distances from a plurality of charge pumps. Accordingly, the internal high voltage level in the worst case can be detected, and thus the internal high voltage can reliably be held at equal or higher than a prescribed voltage level over the entire internal high voltage line.

Fourth Embodiment

Figure 12:
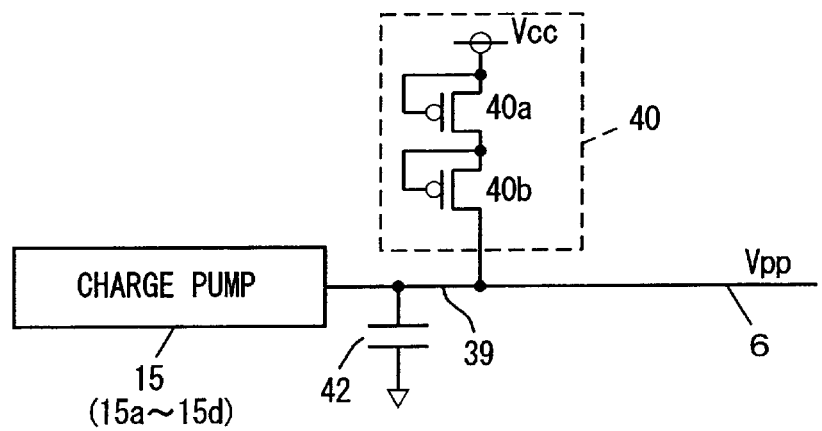
FIGS. 12 and 13 are diagrams schematically showing configurations of main portions of synchronous semiconductor memory devices according to fourth and fifth embodiments of the present invention, respectively.

FIG. 12 is a diagram schematically showing a configuration of the main portion of a synchronous semiconductor memory device according to the fourth embodiment of the present invention. Specifically, FIG. 12 shows a configuration of a portion corresponding to one charge pump 15 (15a–15d) Referring to FIG. 12, a clamp element 40 for clamping a voltage level on internal high voltage line 6 is provided at an output node 39 of charge pump 15. Clamp element 40 determines an upper limit value of internal high voltage Vpp on internal high voltage line 6. Clamp element 40 includes diode-connected p channel MOS transistors 40a and 40b serially connected between internal high voltage line 6 and a power supply node. For a power supply voltage Vcc to be supplied to the power supply node, an appropriate voltage is selected according to the voltage level of internal high voltage Vpp, and may be power supply voltage Vcep for peripheral circuits, or outputting power supply voltage Vccq.

A stabilizing capacitance 42 is further provided for output node 39 of charge pump 15, which stores charges output by charge pump 15 to stabilize internal high voltage Vpp on internal high voltage line 6.

Clamp element 40 shown in FIG. 12 limits the upper limit value of internal high voltage Vpp to a voltage level of Vcc+2·Vthp. If internal high voltage Vpp exceeds the voltage Vcc+2·Vthp, MOS transistors 40a and 40b both turn ON, causing a current to flow from internal high voltage line 6 to the power supply node, and thus the voltage level of internal high voltage Vpp is decreased. If internal high voltage Vpp becomes lower than voltage Vcc+2·Vthp, clamp element 40 is inactivated (i.e., at least one of MOS transistors 40a and 40b is in an OFF state).

Provision of clamp element 40 can prevent internal high voltage Vpp from being driven to an unnecessarily high voltage level, thereby improving the reliability of a component receiving internal high voltage Vpp. Specifically, the highest reachable voltage of charge pump 15, which is 2·Vccp–2·Vthp in the case of the charge pump shown in FIG. 3, can be raised up to the level of 2·Vcc in some other configurations of charge pump 15. In such a case, an unnecessarily high voltage may be supplied to a highly integrated or miniaturized component, which may destruct the component By providing clamp element 40, destruction of the component can be prevented, and the reliability of a circuit using internal high voltage Vpp is guaranteed.

Further, provision of clamp element 40 enables setting of an upper limit value of internal high voltage Vppq, and accordingly, the voltage level of internal high voltage Vpp can be set at an optimum voltage level according to the voltage level of power supply voltage Vccq of the output circuit.

In the configuration shown in FIG. 12, clamp element 40 includes two diode-connected p channel MOS transistors. However, clamp element 40 may be formed of n channel MOS transistors, and also, the number of diode-connected MOS transistors may only be an appropriate number depending on the clamp voltage level of internal high voltage Vpp.

As described above, the fourth embodiment of the present invention is provided with a clamp element at an output portion of the charge pump for setting an upper limit value of the internal high voltage. Accordingly, internal high voltage Vpp can be set at a prescribed voltage level accurately, while ensuring the reliability of a component of the internal circuit.

Fifth Embodiment

Figure 13:
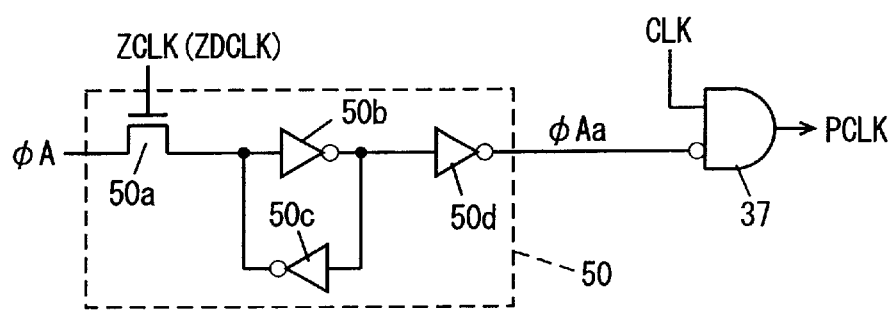

FIG. 13 is a diagram schematically showing a configuration of the main portion of a synchronous semiconductor memory device according to the fifth embodiment of the present invention. Specifically, FIG. 13 shows a configuration of a portion generating pump clock signal PCLK. With reference to FIG. 13, the pump clock generating portion includes a latch circuit 50 taking in and latching pump control signal φA in response to complemental internal clock signal ZLCK, and a gate circuit 37 generating pump clock signal PCLK according to an output signal from latch circuit 50 (a second pump control signal) φAa and internal clock signal CLK. Gate circuit 37 has a configuration the same as shown in FIG. 11.

Latch circuit 50 includes a transfer gate 50a rendered conductive when complemental internal clock signal ZCLK is at an H level, to pass pump control signal φA; an inverter 50b inverting a signal from transfer gate 50a; an inverter 50d inverting an output signal of inverter 50b to generate the second pump control signal φAa; and an inverter 50c inverting the output signal of inverter 50b and transmitting the inverted signal to an input portion of inverter 50b.

Figure 14:
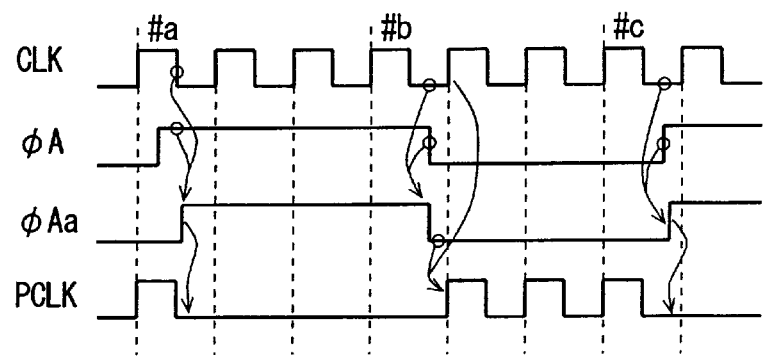
FIG. 14 is a timing chart representing an operation of the circuit in FIG. 13.

Now, the operation of the pump clock signal generating portion shown in FIG. 13 will be described with reference to a timing chart shown in FIG. 14.

When internal clock signal CLK is at an H level, complemental internal clock signal ZLCK is at an L level, and transfer gate 50a is OFF. Accordingly, second pump control signal φAa remains in its previous state. When internal clock signal CLK falls to an L level, complemental internal clock signal ZCLK rises to an H level. Accordingly, transfer gate 50a is rendered conductive to pass pump control signal φA from level detection circuit 30 shown in FIG. 9, which is then latched by inverters 50b and 50c. Therefore, as shown in FIG. 14, even when pump control signal φA from level detection circuit 30 rises to an H level at the time when internal clock signal CLK is at an H level, second pump control signal φAa does not change until internal clock signal CLK falls to an L level. This means that pump clock signal PCLK is generated according to internal clock signal CLK in the clock cycle #a.

In the clock cycle #b, when pump control signal φA falls to an L level at the time when internal clock signal CLK is at an L level, second pump control signal φAa immediately falls to an L level, since transfer gate 50a is at an ON state. Therefore, generation of pump clock signal PCLK starts at a clock cycle following the clock cycle #b, according to internal clock signal CLK.

Further, suppose that, in the clock cycle #c, pump control signal φA rises at the time when internal clock signal CLK is at an L level. Since transfer gate 50a is at an ON state, second pump control signal φAa also rises to an H level in response to the rise of pump control signal φA, and pump clock signal PCLK is fixed to an L level.

By using the configuration as shown in FIG. 13, pump clock signal PCLK having an H level duration equal to that of internal clock signal CLK can normally be generated. Therefore, charge pumping operation using pump clock signal PCLK with incomplete waveforms (of which the H level duration is short) can be prevented, and thus the charge supplying amount at each clock cycle can accurately be maintained constant. Consequently, internal high voltage Vpp can be kept at a prescribed voltage level stably.

Now, suppose the case in which the H level duration of pump clock signal PCLK is short. When the internal node of the charge pump is rising to a prescribed voltage level, pump clock signal PCLK will fall to an L level. Accordingly, the voltage level of the internal node will be lowered more than necessary, and a large voltage can be applied across a junction of the outputting diode-connected MOS transistors. This may damage the reliability of components. By using the configuration as shown in FIG. 13, however, pump clock signal PCLK can be generated in response to internal clock signal CLK at each clock cycle, which ensures stable generation of internal high voltage Vpp without damaging the reliability of the components.

Here, frequency divided clock signal DCLK may be used instead of internal clock signal CLK. In this case, latch circuit 50 is supplied with complemental frequency divided clock signal ZCLK (ZCLK0–ZCLK3).

Further, the configuration of FIG. 13 is provided for each charge pump,

Modification

Figure 15:
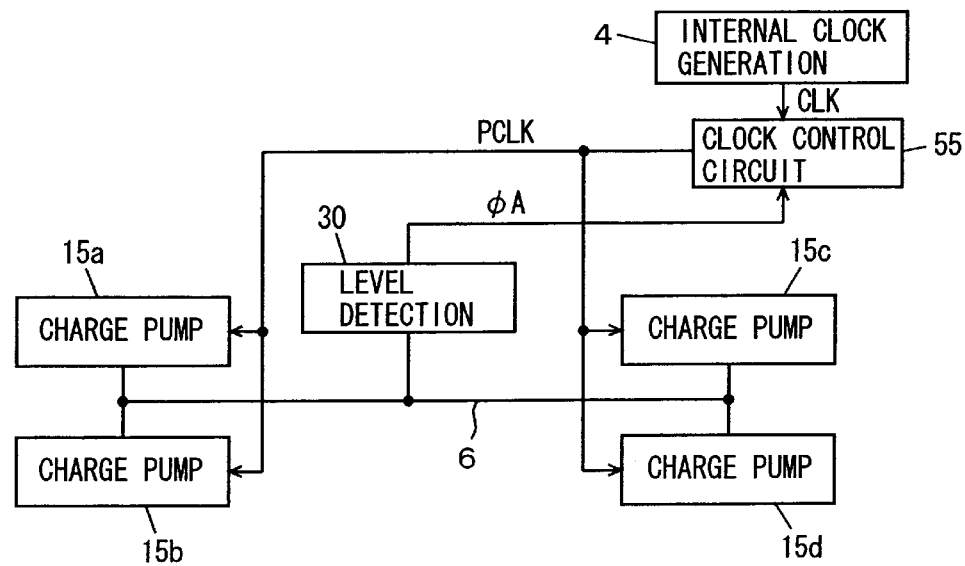
FIG. 15 is a diagram schematically showing a configuration of a modification of the fifth embodiment of the present invention.

FIG. 15 schematically shows a configuration according to the modification of the fifth embodiment of the present invention. In the configuration shown in FIG. 15, pump control signal φA from the level detection circuit is supplied to a clock control circuit 55. Clock control circuit 55, which has the same configuration as in FIG. 13, processes internal clock signal CLK from internal clock generating circuit 4 according to pump control signal φA to generate pump clock signal PCLK for application to charge pumps 15a–15d.

In the configuration shown in FIG. 15, the charge pumping clock control circuit 55 is commonly provided for charge pumps 15a–15d. This eliminates the necessity of providing a control circuit (latch circuit 50 and gate circuit 37) for each charge pump, thereby decreasing circuit occupation area.

Suppose the case in which frequency divided clock signals DCLK0–DCLK3 are used as pump clock signal PCLK in the configuration as shown in FIG. 15. In clock control circuit 55, a latch 50 is commonly provided for the frequency divided clock signals, and a gate circuit 37 is provided for each respective frequency divided clock signal, and generation of the frequency divided clock signals is controlled. Even in this case, the latch can be commonly provided for a plurality of charge pumps, which leads to reduction in circuit occupation area.

As described above, the fifth embodiment of the present invention is configured to generate, according to pump control signal φA from the level detection circuit for detecting the internal high voltage level, a pump signal from a pulse signal at the next clock cycle following the detection of level reduction. Accordingly, charge pumping operation can be performed based on accurate clock waveforms, and thus accurate pumping operation is guaranteed.

Sixth Embodiment

Figure 16:
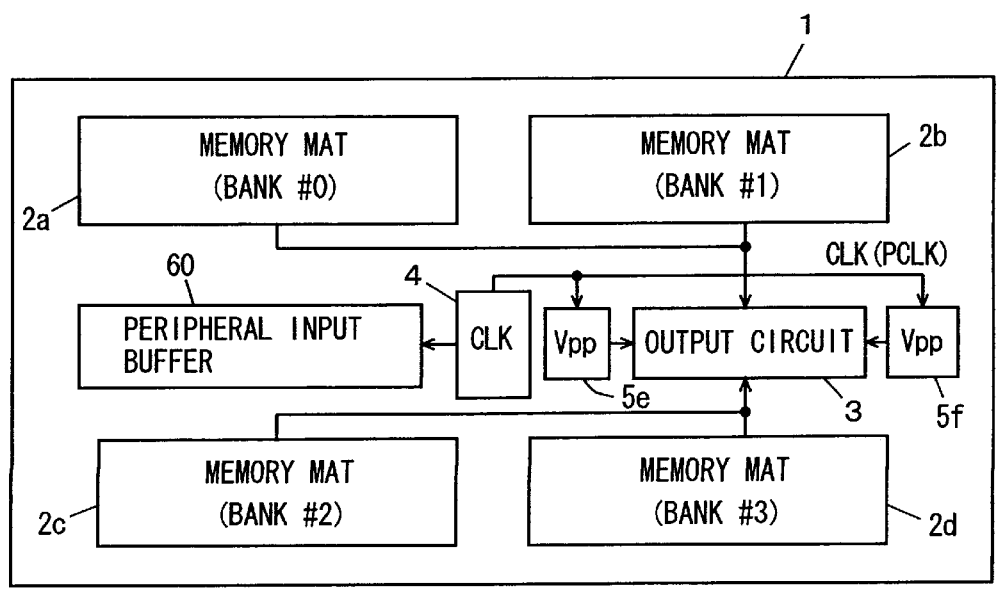
FIG. 16 is a diagram schematically showing an entire configuration of a semiconductor device according to a sixth embodiment of the present invention.

FIG. 16 is a diagram schematically showing an entire configuration of a semiconductor device according to the sixth embodiment of the present invention. Referring to FIG. 16, the semiconductor device 1 includes four memory mats 2a–2d arranged in respective quad-divided areas of the chip. These memory mats 2a–2d form banks, which can be driven to activated or inactivated states independent from each other. Herein, the activated state means a state in which a memory cell row in a memory mat is driven to a selected state. Though memory mats 2a–2d form banks #0–#3, respectively, in FIG. 16, the number of the banks is not limited to 4, and may be 2, instead in the central region of the semiconductor device, an output circuit 3 for outputting data is disposed in the central region between memory mats 2b and 2d. Output circuit 3 receives data from memory mats 2a–2d, and outputs the data in synchronization with a clock signal. Charge pump circuits 5e and 5f each for generating high voltage Vpp and supplying the same to output circuit 3 are disposed at both sides of output circuit 3 in the direction of the longer sides of the chip. Charge pump circuits 5e and 5f each have a configuration similar to those described in the previous first through fifth embodiments. They perform charge pumping operation according to internal clock signal CLK (or PCLK from internal clock generating circuit 4 provided at the center of the chip, to generate high voltages Vpp for supply to output circuit 3.

A peripheral input buffer 60 is provided at the central region between memory mats 2a and 2c, which receives an externally applied control signal as well as address signal. Peripheral input buffer 60 takes in the external control signal and address signal in synchronization with the internal clock signal from internal clock generating circuit 4, and generates an internal signal. Instead of disposing the data output circuit and the peripheral circuit adjacent to each other at the central region in the direction of the shorter sides of the chip as in an ODIC (Outer DQ Inner Control) configuration shown in FIG. 1, peripheral input buffer 60 and output circuit 3 are disposed at separate central regions in this embodiment, thereby implementing an efficient layout of peripheral input buffer 60.

Figure 17A:
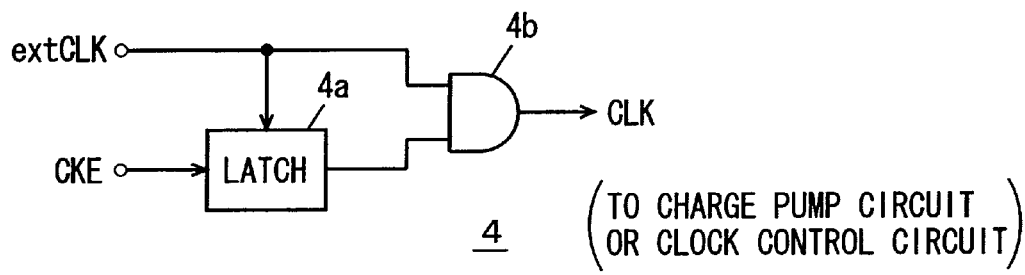
FIG. 17 A shows a configuration of the internal clock generating circuit in FIG.16.
FIG. 17B is a timing chart representing an operation of the circuit in FIG. 17A.
Figure 17B:
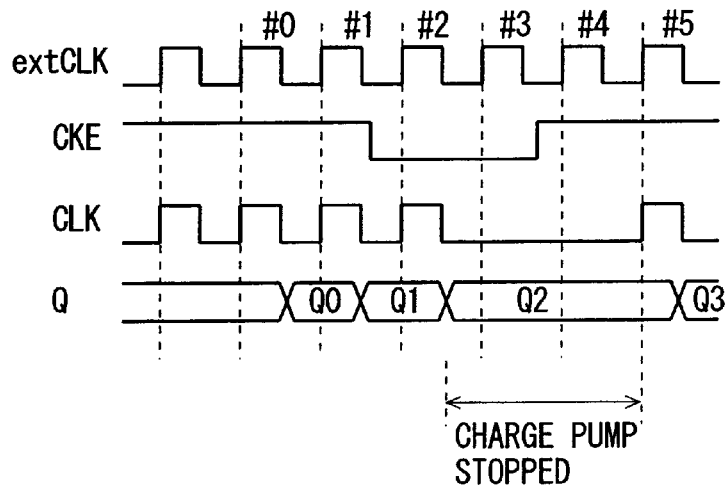

FIG. 17A schematically shows a configuration of internal clock generating circuit 4 shown in FIG. 16. Referring to FIG. 17A, internal clock generating circuit 4 includes a latch circuit 4a latching an externally supplied clock enable signal CKE in synchronization with external clock signal ext.CLK, and an AND circuit 4b receiving an output signal of latch circuit 4a and external clock signal ext.CLK to generate internal clock signal CLK. Latch circuit 4a takes in clock enable signal CKE in synchronization with a rise of external clock signal ext.CLK, and outputs the taken in clock enable signal CKE in synchronization with a fall of external clock signal ext.CLK. Internal clock signal CLK from AND circuit 4b is applied to the charge pump circuit or clock control circuit 55 as described in the previous first through fifth embodiments. Now, an operation of internal clock signal generating circuit 4 shown in FIG. 17A will be described with reference to a timing chart shown in FIG. 17B.

A read command is supplied, and internal read data is output in the clock cycle #0 of external clock signal ext-.CLK. In this state, clock enable signal CKE is at an H level, the output signal from latch 4a is held at an H level, and AND circuit 4b generates internal clock signal CLK according to external clock signal ext.CLK. Accordingly, data Q0 read out in synchronization with internal clock signal CLK is externally output in clock cycle #0. Clock enable signal CKE falls to an L level in the clock cycle #1, however, in that cycle clock enable signal CKE at the H level is already taken in at a rise of external clock signal ext.CLK. Internal clock signal CLK is generated, and according to this internal clock signal CLK, data Q1 is output.

In the clock cycle #2, clock enable signal CKE at the L level is latched by latch 4a at a rise of external clock signal ext.CLK. However, since latch 4a outputs the latched signal in synchronization with a fall of external clock signal ext.CLK internal clock signal CLK is generated also in this clock cycle #2, and the next data Q2 is output in synchronization with this internal clock signal CLK. In the clock cycle #3, the output signal of latch 4a attains an L level, and internal clock signal CLK is not generated and maintained at the L level. Since internal clock signal CLK is applied to each circuit portion, internal operation of the semiconductor device is stopped (i.e., the state at clock cycle #2 is maintained). Accordingly, data Q2 is output continuously in clock cycle #3.

Since clock enable signal CKE is still at the L level at a rising of clock signal ext.CLI in clock cycle #3, internal clock signal CLK maintains the L level in the clock cycle #4, and data QZ is output continuously. In clock cycle #4, clock enable signal CKE is set at an H level, and the output signal of latch 4a attains an H level in synchronization with a fall of external clock signal ext.CLK. In response, internal clock signal CLK is output in the clock cycle #5, and the next data Q3 is output.

Clock enable signal CKE can be used to stop the internal operation, and an external processor, for example, can adjust timing for incorporating data. Setting of clock enables signal CKE at an L level can stop generation of internal clock signal CLK in the next clock cycle. Consequently, the output circuit maintains the state in the previous cycle during this period, and performs no switching operation. At this time in which output circuit 3 does not operate, pumping operation can also be stopped by supplying internal clock signal CLK to the charge pump circuit or the clock control circuit, and therefore, unnecessary current dissipation can be reduced.

Clock enable signal CKE is normally used to stop generation of internal clock signal CLK even when external clock signal ext.CLK is supplied in a standby state, to reduce current dissipation of the synchronous semiconductor device. Clock enable signal CKF is also used to set a refresh mode.

As shown in FIG. 17A, charge pumping operation is performed using internal clock signal CLK generated according to clock enable signal CKE. Therefore, pumping operation in an unnecessary time period can be stopped, which reduces current dissipation.

Figure 18:
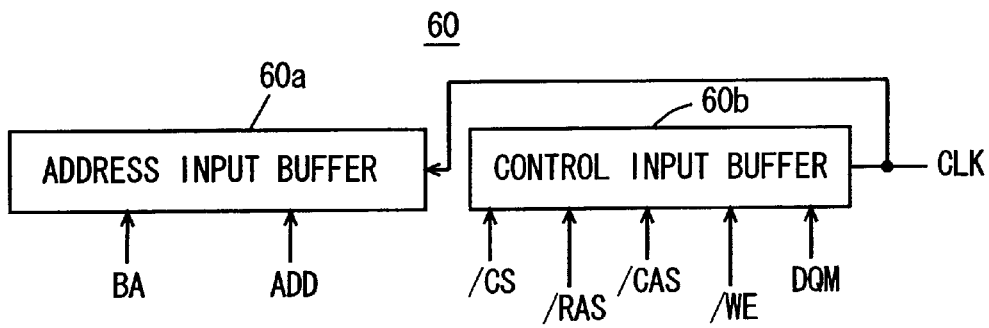
FIG. 18 is a diagram schematically showing a configuration of the peripheral input buffer in FIG. 16.

FIG. 18 schematically shows a configuration of peripheral input buffer 60 shown in FIG. 16. Referring to FIG., 18, peripheral input buffer 60 includes an address input buffer 60a taking in externally supplied bank address signal BA and address signal ADD in synchronization with internal clock signal CLK, and a control input buffer 60b receiving, in synchronization with internal clock signal CLK, externally applied control signals, i.e., a Hip select signal /CS, a row address strobe signal RAS, a column address strobe signal /CAS, a write enable signal /WE and a data mask designating signal DQM. Bank address signal BA specifies banks #0–#3 shown in FIG. 6, and address signal ADD specifies a memory cell row or column in banks #0–#3. Chip select signal /CS is a signal indicating whether the synchronous semiconductor device is selected. When this chip select signal /CS is at an HI level, externally supplied control signals are regarded as an "NOP (no operation)" command. When the signal is set at an L level, the command it made valid and taken into the synchronous semiconductor device. A command designating an operation mode is supplied according to a combination of the states of row address strobe signal /RAS, column address strobe signal /CAS and write enable signal /WE (a specific bit of address signal ADD may be used as a part of a command).

Figure 19:
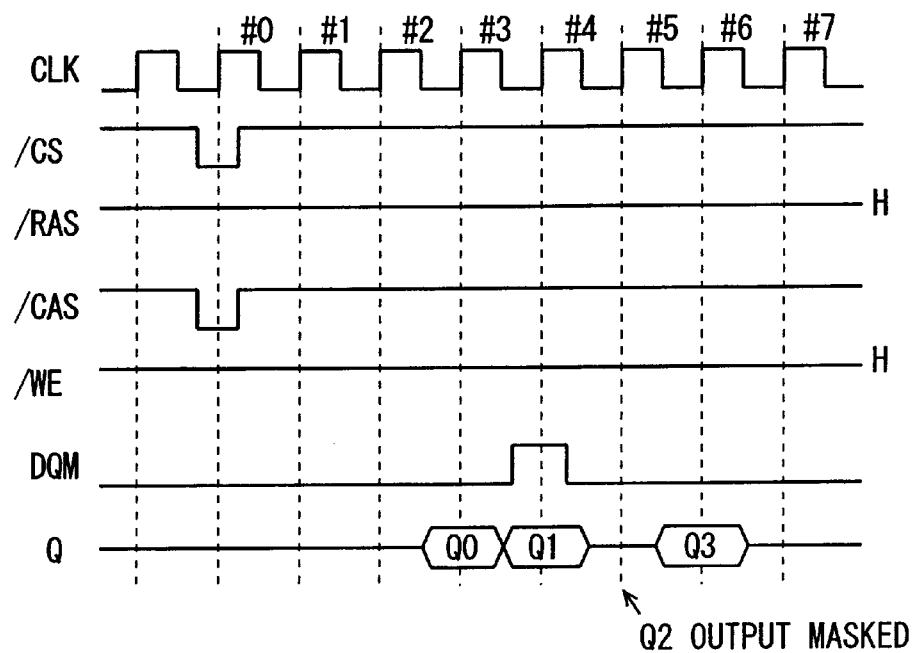
FIG. 19 is a timing chart representing an operation of the peripheral input buffer shown FIG. 18.

Data mask designating signal DQM is a signal for masking data writing/reading. If data mask designating signal DQM is set at an H level in data writing, write data in that clock cycle is masked and not written into a memory cell. If data mask designating signal DQM is set at the H level in data reading, read data in the following clock cycle is masked. Now, the operational effect of the data mask designating signal will be described with reference to a timing chart shown in FIG. 19.

In clock cycle #0, chip select signal /CS and column address strobe signal /CAS are lowered to an L level, and row address strobe signal /RAS and write enable signal /WE are held at an H level. The combination of these states of the control signals represents a read command, which in turn instructs data reading. Address signal ADD and bank address signal BA simultaneously applied with the read command are taken in, and data of a memory cell is read out at the designated bank. The data is output after a CAS latency (3 in FIG. 19). Data Q0 is read out in clock cycle #2, and attains a definite state at a rising of clock signal CLK in clock cycle #3.

In clock cycle #4, data mask designating signal DQM is set at an H level at a rising of clock signal CLK. In this state, internally read out data Q1 is output. Data to be read out next is masked according to data mask designating signal DQM. At a rising of clock signal CLK in clock cycle #5, the output circuit is set at an output high impedance state. Therefore, in this state, data Q1 is continuously output (it enters the high impedance state when data Q1 is output). Accordingly, the output of data Q2 to be subsequently output is masked.

Data mask designating signal DQM is set at the II level only in clock cycle #4. In clock cycle #6, the next data Q3 is output.

By using this data mask designating signal DQM, an external processor or a logic can take in and process only necessary data.

Figure 20:
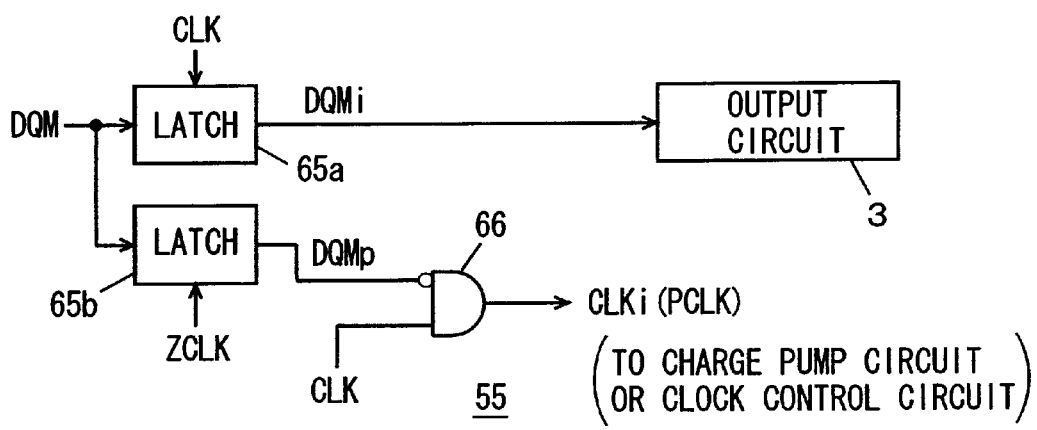
FIG. 20 is a diagram schematically showing a configuration of a main portion of asynchronous semiconductor device according to the sixth embodiment of the present invention.

FIG. 20 is a diagram schematically showing a configuration of the main portion of a synchronous semiconductor device according to the sixth embodiment of the present invention. Specifically, FIG. 20 shows a path for the data mask designating signal. With reference to FIG. 20, a latch 65a is provided for output circuit 3, which takes in data mask designating signal DQM in synchronization with clock signal CLK. Latch 65a takes in data mask designating signal DQM at a ring of clock signal CLK, and at a falling of clock signal CLK, generates internal data mask designating signal DQMi from the taken data mask designating signal DQM for application to output circuit 3. Accordingly, internal data mask designating signal DQM is a signal delayed by a half clock cycle behind external data mask designating signal DQM. Output circuit 3 is set at the output high impedance state when this internal data mask designating signal DQMi is at an H level (an output enable signal OEM is forcibly set to an inactivated state).

To control charge pumping operation, there are further provided a latch 65b taking in external data mask designating signal DQM in synchronization with complemental clock signal ZCLK, and a gate circuit 66 receiving a pump mask designating signal DQMp output from latch 65b and internal clock signal CLK to generate clock signal CLKi. Clock signal CLKi (PCLK) from gate circuit 66 is applied as the internal clock signal to the charge pump circuit or the clock control circuit previously described in the first through fifth embodiments.

Figure 21:
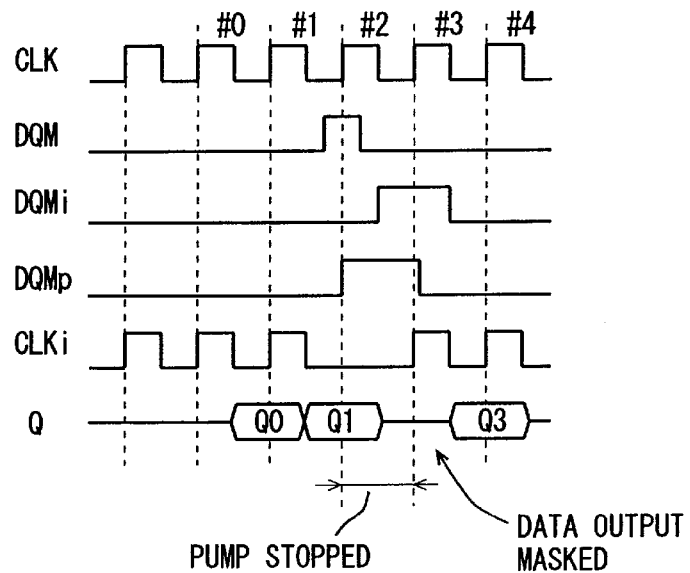
FIG. 21 is a timing chart representing an operation of the circuit in FIG. 20.
Figure 22:
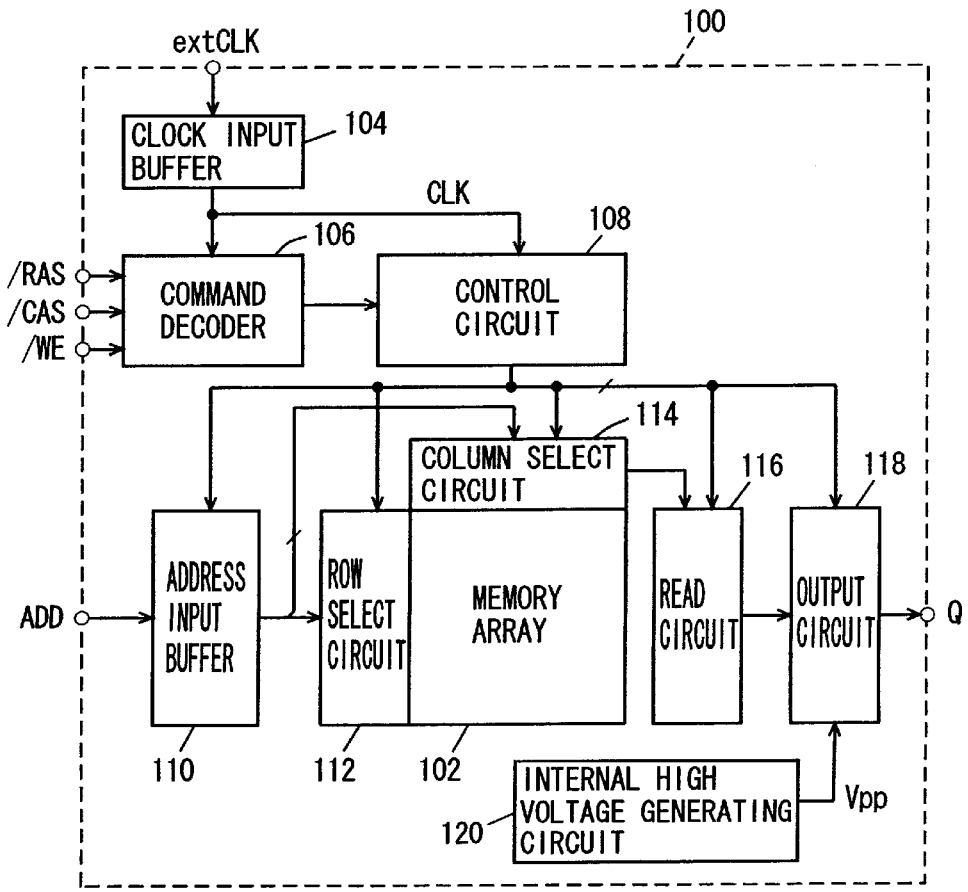
FIG. 22 is a diagram schematically showing an entire configuration of a conventional synchronous semiconductor memory device.
Figure 23:
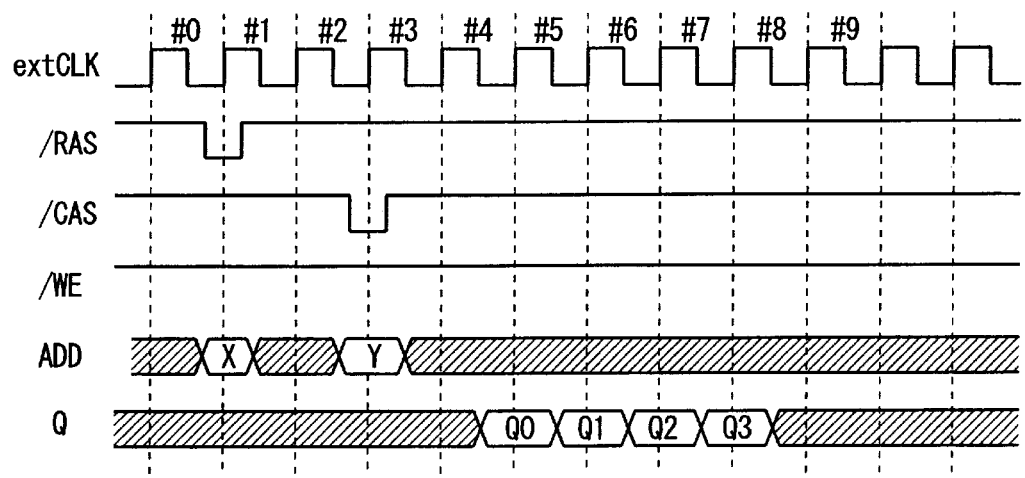
FIG. 23 is a timing chart representing an operation of the synchronous semiconductor memory device shown in FIG. 22.

Latch 65b takes in externally supplied data mask designating signal DQM at a rising of complemental clock signal ZCLK, and outputs the taken in data mask designating signal as pump mask designating signal DQMp at a falling of complemental clock signal ZCLK Gate circuit 66 is disabled when pump mask designating signal DQMp is at an H level, and stops generation of internal clock signal CLKi (PCLL). Now, operation of the circuit shown in FIG. 20 will be described with reference to a timing chart shown in FIG. 21.

After a prescribed CAS latency since a read command is supplied, data Q0 is output in clock #0, and attains a definite state at a rising of clock signal CLK in clock cycle #1. In this state, externally supplied data mask designating signal QDM is at an L level, and internal mask designating signal DQMi and pump Ash designating signal DQMp are both at an L level.

Data mask designating signal DQM is at an L level at a rising of clock signal CLK in clock cycle #1, and thus output circuit 3 outputs data Q1 in synchronization with internal clock signal CLK.

External data mask designating signal DQM is set at an H level at a rising of clock signal CLK in clock cycle #2 In response to the data mask designating signal DQM set at the H level in clock cycle #2, latch 65b takes in this H level data mask designating signal DQM, and drives pump mask designating signal DQMp to an H level in synchronization with a rise of internal clock signal CLK (the signal taken in is output in synchronization with a fall of complemental clock signal ZCLK). Latch 65b holds pump mask designating signal DQMp at the H level for one clock cycle. Accordingly, generation of internal clock signal CLKi from gate circuit 66 is stopped in clock cycle #2, and no charge pumping operation is performed.

Internal data mask designating signal DQMi rises to an H level in synchronization with a fall of clock signal CLK, and data to be output in clock cycle #2 is masked. Accordingly, output circuit 3 enters an output high impedance state at a rising of clock signal CLK in clock cycle #3, thereby masking the outputting of data Q2 to be read (output circuit 3 is held at the output high impedance state).

Since external data mask designating signal DQM is set at the H level only in clock cycle #2, pump mask designating signal DQMp falls to an L level in synchronization with a rising of clock signal CLK in clock cycle #3. Internal clock signal CLKi is generated in synchronization with internal clock signal CLK, and charge pumping operation is performed. In clock cycle #3, internal data mask designating signal DQMi falls to an L level in synchronization with a fall of internal clock signal CLK, and therefore, output circuit 3 buffers data supplied from a read circuit (not shown in FIG. 20; see FIG. 4), and externally outputs data Q3.

As long as data outputting is masked, output circuit 3 does not operate, and consumes no high voltage Vpp. Slopping of generation of pumping clock signal CLKi during the time period in which output circuit 3 performs no switching operation leads to reduction in unnecessary current dissipation. This period for stopping generation of pumping clock signal CLKi may be a clock cycle period in which data mask designating signal DQM is set at an H level. Accordingly, pumping internal clock signal CLKi can reliably be generated according to internal clock signal CLK for data to be read after release from the masking, and therefore, pumping operation can be so performed as to compensate for high voltage consumption for the next read data. Accordingly, it becomes possible to implement a synchronous semiconductor device allowing outputting of data at high speed with low current dissipation.

As described above, the sixth embodiment of the present invention is configured to stop generation of the pumping clock signal when no data outputting is performed, which leads to reduction in unnecessary current dissipation, and enables implementation of a synchronous semiconductor device capable of outputting data stably with low current dissipation.

Other Applications

There has been described above a synchronous semiconductor memory device operating in synchronization with an externally supplied clock signal. However, the semiconductor memory device may be a static random access memory (SRAM), a dynamic random access memory, or a flash memory.

Further, the present invention may be generally applicable to any semiconductor device, as long as the device inputs/outputs a signal in synchronization with an externally supplied clock signal, and a high voltage is used at its signal output portion.

In the case of a synchronous semiconductor memory device, the charge pump circuit may be configured to be activated only during the time period in which data reading is performed, i.e., during the clock cycles corresponding to a CAS latency and a burst length after the supply of a read command instructing data reading.

As described above, according to the present invention, a stable generation of an internal voltage at a prescribed voltage level becomes possible without increasing chip area.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor device operating in synchronization with a clock signal formed of a series of pulses, comprising:
a plurality of internal voltage generating circuits disposed separately from each other, for performing charge pumping operation using said clock signal as a charge pumping signal to generate internal voltages; and
internal circuitry receiving the internal voltages from said plurality of internal voltage generating circuits for operation, said plurality of internal voltage generating circuits being coupled to said internal circuitry to commonly supply the internal voltages to said internal circuitry.

2. The synchronous semiconductor device according to claim 1, wherein said internal circuitry includes a plurality of output circuits provided in parallel to each other, for outputting data in synchronization with said clock signal.

3. The synchronous semiconductor device according to claim 1, further comprising a frequency dividing circuit for frequency-dividing said clock signal for application to said plurality of internal voltage generating circuits, wherein a factor of the frequency-dividing is given by the number of said plurality of internal voltage generating circuits.

4. The synchronous semiconductor device according to claim 1, further comprising level detecting circuitry provided at a prescribed location and commonly to said plurality of internal voltage generating circuits, for detecting a level of the internal voltage at the prescribed location to control charge pumping operation of said plurality of internal voltage generating circuits according to a result of detection.

5. The synchronous semiconductor device according to claim 4, wherein said prescribed location is a location substantially at equal distances from said plurality of internal voltage generating circuits.

6. The synchronous semiconductor device according to claim 1, wherein each of said plurality of internal voltage generating circuits includes, at an output thereof, a clamp element for clamping the internal voltage outputted therefrom to a prescribed voltage level.

7. The synchronous semiconductor device according to claim 4, wherein said level detecting circuitry includes a circuit responsive to detection of the internal voltage at said prescribed location being at or lower than a prescribed level, for causing said plurality of internal voltage generating circuits to start pumping operation at a next pulse of the clock signal subsequent to the detection.

8. The semiconductor device according to claim 1, wherein said internal circuitry comprises a data output circuit for externally applying an internal data, and said plurality of internal voltage generating circuits include circuits arranged at opposing sides of said data output circuit, for applying a high voltage to said data output circuit as the internal voltages.

9. The semiconductor device according to claim 1, wherein said plurality of internal voltage generating circuits are coupled via a common internal voltage transmitting line to said internal circuitry.

10. The semiconductor device according to claim 1, wherein said plurality of internal voltage generating circuits are operated interleavingly.

11. The semiconductor device according to claim 4, wherein said level detection circuitry includes a circuit for controlling the charge pumping operation of the internal voltage generating circuits in synchronization with said clock signal.

12. The semiconductor device according to claim 1, further comprising control circuitry responsive to an internal circuitry enable signal being inactive, for inactivating the internal voltage generating circuits.

13. The semiconductor device according to claim 1, wherein said internal circuitry comprises a data output circuit for externally applying internal data in synchronization with said clock signal, and wherein said semiconductor device further comprises control circuitry responsive to a data masking designation signal instructing making of data outputting through said data output circuit, for deactivating the internal voltage generating circuits.

14. The semiconductor device according to claim 13, wherein said control circuitry includes a circuit responsive to said data masking designation signal being active, for stopping transfer of a charge pumping clock signal to the internal voltage generating circuits, said charge pumping clock signal being generated according to said clock signal.

15. A synchronous semiconductor device operating in synchronization with a clock signal formed of a series of pulses, comprising:
- a plurality of internal voltage generators disposed separately from each other, for performing charge pumping operation in response to said clock signal to generate internal voltages, each of said plurality of internal voltage generators including a capacitor for the charge pumping operation, a voltage at an electrode of the capacitor oscillating in accordance with said clock signal; and
- internal circuitry receiving the internal voltages for operation from said plurality of internal voltage generators via a common line provided in common to said plurality of internal voltage generators.

16. The synchronous semiconductor device according to claim 15, wherein said internal circuitry includes an output circuit for outputting data in synchronization with said clock signal.

17. The synchronous semiconductor device according to claim 16, wherein said plurality of internal voltage generators include first and second internal voltage generators located at opposing sides of said output circuit, and said output circuit is supplied with the internal voltages from the first and second internal voltage generators via the common line.

18. The synchronous semiconductor device according to claim 16, further comprising control circuitry for deactivating at least one internal voltage generator in response to a data mask signal instructing masking of data outputting through said data output circuit.

19. The synchronous semiconductor device according to claim 15, further comprising a frequency divider for frequency-dividing said clock signal and supplying said plurality of internal voltage generators with the frequency-divided clock signal.

20. The synchronous semiconductor device according to claim 15, further comprising control circuitry for inactivating at least one of said internal voltage generators in response to an inactivation of an internal circuitry enable signal.

* * * * *